United States Patent
Lim et al.

(10) Patent No.: US 9,106,496 B2
(45) Date of Patent: Aug. 11, 2015

(54) METHOD AND APPARATUS FOR TRANSMITTING AND RECEIVING SIGNAL

(71) Applicant: Electronics and Telecommunications Research Institute, Daejeon (KR)

(72) Inventors: Jong Soo Lim, Daejeon (KR); Sun Hyoung Kwon, Seoul (KR); Heung Mook Kim, Daejeon (KR); Namho Hur, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/354,333

(22) PCT Filed: Oct. 24, 2012

(86) PCT No.: PCT/KR2012/008781
§ 371 (c)(1),
(2) Date: Apr. 25, 2014

(87) PCT Pub. No.: WO2013/062319
PCT Pub. Date: May 2, 2013

(65) Prior Publication Data
US 2014/0294121 A1  Oct. 2, 2014

(30) Foreign Application Priority Data

Oct. 25, 2011 (KR) .................. 10-2011-0109523
Feb. 22, 2012 (KR) .................. 10-2012-0018018
Oct. 16, 2012 (KR) .................. 10-2012-0115055

(51) Int. Cl.
*H03C 3/00* (2006.01)
*H04L 27/26* (2006.01)
*H03C 3/40* (2006.01)
*H04L 27/00* (2006.01)

(52) U.S. Cl.
CPC ........ *H04L 27/2649* (2013.01); *H04L 27/2614* (2013.01); *H04L 27/2634* (2013.01); *H03C 3/40* (2013.01); *H04L 27/0008* (2013.01)

(58) Field of Classification Search
CPC .................................................. H04L 27/0008
USPC ........................................................ 375/302
See application file for complete search history.

(56) References Cited

U.S. PATENT DOCUMENTS

| | | | | |
|---|---|---|---|---|
| 7,230,996 | B2 * | 6/2007 | Matsuura et al. | 375/296 |
| 7,573,949 | B2 * | 8/2009 | Matsuura et al. | 375/295 |
| 8,384,584 | B2 * | 2/2013 | Karr | 342/44 |
| 8,750,441 | B2 * | 6/2014 | Zuckerman | 375/349 |
| 8,798,191 | B2 * | 8/2014 | Matsuura | 375/295 |
| 2004/0038648 | A1 * | 2/2004 | Matsuura et al. | 455/101 |
| 2007/0009062 | A1 * | 1/2007 | Matsuura et al. | 375/296 |
| 2009/0022234 | A1 * | 1/2009 | Wang et al. | 375/260 |
| 2009/0079511 | A1 * | 3/2009 | Matsuura et al. | 332/145 |
| 2009/0291648 | A1 * | 11/2009 | Lee | 455/102 |
| 2010/0014559 | A1 | 1/2010 | Nieto et al. | |
| 2010/0150272 | A1 | 6/2010 | Nieto | |
| 2012/0154031 | A1 * | 6/2012 | Zuckerman | 327/551 |
| 2013/0259161 | A1 * | 10/2013 | Lim | 375/302 |

* cited by examiner

*Primary Examiner* — Santiago Garcia
(74) *Attorney, Agent, or Firm* — William Park & Associates Ltd.

(57) ABSTRACT

Modulation is performed on a first input signal and a second input signal to be transmitted based on symbol mapping. Phase values of the first and second modulated input signals are selectively adjusted. Angle modulation is performed on the first input signal and the second input signal having selectively adjusted phase values. The angle-modulated first and second input signals are transmitted.

19 Claims, 17 Drawing Sheets

(a) Sθ1($t_k$)

(b) Sθ2($t_k$)

(a) sin( Sθ1($t_k$))

(b) sin( Sθ2($t_k$))

METHOD AND APPARATUS FOR TRANSMITTING AND RECEIVING SIGNAL

TECHNICAL FIELD

The present invention relates to a method and apparatus for transmitting and receiving signals.

BACKGROUND ART

OFDM (orthogonal frequency division multiplexing), having a simple equalizer, is resistant to multi-path fading, and has thus recently been widely used in wireless communication. OFDM has been adopted to be used in various wireless communication systems such as a wireless local area network (WLAN), a wireless metropolitan area network (WMAN), digital audio broadcasting (DAB), and digital video broadcasting (DVB).

However, in general, an OFDM signal has a very high peak-to-average power ratio (PAPR) in a transmitter. Such a high PAPR causes a transmission apparatus based on OFDM to be very sensitive to non-linear distortion caused by a power amplifier (PA). Without sufficient backoff with respect to power, a frequency spectrum of a system broadens and distortion is generated due to inter-frequency modulation to result in degradation of system performance.

Thus, PAPR may be reduced to 0 dB by combining OFDM modulation and angle modulation. Such a modulation scheme is called constant envelope orthogonal frequency division multiplexing (CD-OFDM). The CE-OFDM scheme satisfies OFDM characteristics to be resistant to multi-path facing and has a uniform amplitude.

DISCLOSURE

Technical Problem

The present invention has been made in an effort to provide a method and apparatus for transmitting and receiving signals in a wireless communication system using constant envelope orthogonal frequency division multiplexing (CE-OFDM).

Technical Solution

An exemplary embodiment of the present invention provides a transmission method including: performing modulation on a first input signal and a second input signal to be transmitted based on symbol mapping; adjusting a phase value of the second modulated input signal; performing angle modulation on the first input signal; performing angle modulation on the second input signal having the adjusted phase value; and transmitting the angle-modulated first and second input signals.

The method may further include scaling phase values of the first modulated input signal and the second modulated input signal such that they are positioned within a pre-set range, after the modulation is performed.

In the adjusting of the phase value of the second input signal, a scaled phase value of the second input signal may be adjusted, and in the performing of angle modulation on the first input signal, angle modulation may be performed on the scaled first input signal.

In the positioning, the phase values may be scaled such that phase values of the first input signal and the second input signal are greater than $-\pi/4$ and smaller than $\pi/4$.

The method may further include adjusting a phase of the modulated first input signal, and wherein, in the performing of angle modulation on the first input signal, angle modulation may be performed on the first input signal having the adjusted phase value.

In the adjusting of the phase value of the first input signal and in the adjusting of the phase value of the second input signal, the phase values of the corresponding input signals may be adjusted based on phase adjustment values making a phase difference between the phase value of the first input signal and the phase value of the second input signal a pre-set value.

In the performing of angle modulation on the first input signal and in the performing angle modulation on the second input signal, angle modulation may be performed by converting phase values of the corresponding input signals into cos (phase value)+j×sin(phase value).

Another embodiment of the present invention provides a transmission apparatus including: a first transmission processing unit configured to perform modulation on a first input signal to be transmitted based on symbol mapping, and perform angle modulation on the modulated first input signal; a second transmission processing unit configured to perform modulation on a second input signal to be transmitted based on symbol mapping, adjust a phase of the modulated second input signal, and perform angle modulation on the phase-adjusted second input signal; and a transmission unit configured to transmit the angle-modulated first and second input signals.

The first transmission processing unit may include: a signal conversion unit configured to convert the first input signal into a parallel signal; a symbol mapping unit configured to perform symbol mapping on the first input signal in the parallel form; an inverse fast Fourier transform (IFFT) unit configured to perform IFFT on the symbol-mapped first input signal; a scaling unit configured to perform scaling such that phase values corresponding to the IFFT-transformed first input signal are positioned within a pre-set range; and an angle modulation unit configured to angle-modulate the scaled first input signal.

The second transmission processing unit may include: a signal conversion unit configured to convert the second input signal into a parallel signal; a symbol mapping unit configured to perform symbol mapping on the second input signal in the parallel form; an IFFT unit configured to perform IFFT on the symbol-mapped second input signal; a scaling unit configured to perform scaling such that phase values corresponding to the IFFT-transformed second input signal are positioned within a pre-set range; a phase adjusting unit configured to adjust phases of the phase values corresponding to the scaled second input signal; and an angle modulation unit configured to angle-modulate the phase-adjusted second input signal.

The first transmission processing unit may further include a phase adjusting unit configured to adjust phases of the phase values corresponding to the scaled first input signal, wherein the angle modulation unit may angle-modulate the phase-adjusted second input signal.

The phase adjusting unit of the first transmission processing unit and the phase adjusting unit of the second transmission processing unit may adjust the phase values of the corresponding input signals based on phase adjustment values making a phase difference between the phase value of the first input signal and the phase value of the second input signal a pre-set value.

The transmission unit may include: a signal combining unit configured to combine the angle-modulated first input signal and the angle-modulated second input signal to generate a transmission signal; a signal amplifying unit configured to amplify the transmission signal; and a transmission antenna configured to transmit the transmission signal.

The transmission unit may include: a signal amplifying unit configured to amplify the angle-modulated first input signal; a signal amplifying unit configured to amplify the angle-modulated second input signal; a signal combining unit configured to combine the amplified first input signal and second input signal to generate a transmission signal; and a transmission antenna configured to transmit the transmission signal.

The transmission unit may include: a signal amplifying unit configured to amplify the angle-modulated first input signal; a signal amplifying unit configured to amplify the angle-modulated second input signal; a transmission antenna configured to transmit the amplified first input signal; and a transmission antenna configured to transmit the amplified second input signal.

Yet another embodiment of the present invention provides a reception method including: receiving reception signals as a first angle-modulated input signal and a second angle-modulate input signal from a transmission apparatus; obtaining phase information as phase values of the first input signal and the second input signal before being angle-modulated; separating the reception signals into a first reception signal corresponding to the first input signal and a second reception signal corresponding to the second input signal based on the phase information; demodulating the first reception signal to obtain data corresponding to the first input signal; and demodulating the second reception signal to obtain data corresponding to the second input signal.

The obtaining of the phase information may include: calculating a difference between the first input signal and the second input signal based on the phase difference value between the first input signal and the second input signal; and obtaining phase information as phase values of the first input signal and the second input signal before being angle-modulated, based on the difference between the first input signal and the second input signal.

The obtaining of the phase information in a case that the first input signal and the second input signal are phase-adjusted, angle-modulated, and subsequently transmitted may include: calculating a difference between the first input signal and the second input signal based on the phase difference value between the first input signal and the second input signal; and obtaining phase information as phase values of the first input signal and the second input signal before being angle-modulated, based on the difference between the first input signal and the second input signal, a sum of the first input signal and the second input signal, and phase-adjusted values obtained by adjusting the first input signal and the second input signal such that the phase difference value between the first input signal and the second input signal is a pre-set value.

In the obtaining of the phase information, the phase information as phase values of the first input signal and the second input signal before being angle-modulated may be obtained based on statistical characteristics of respective satellite values constituting the first input signal and the second input signal.

Still another embodiment of the present invention provides a reception apparatus including: an angle demodulation unit configured to receive reception signals as an angle-modulated first signal and an angle-modulated second signal from a transmission apparatus, and separate the reception signals into a first reception signal corresponding to the first input signal and a second reception signal corresponding to the second input signal based on phase information as phase values of the first input signal and the second input signal before being angle-modulated; a first reception processing unit configured to demodulate the first reception signal to obtain data corresponding to the first input signal; and a second reception processing unit configured to demodulate the second reception signal to obtain data corresponding to the second input signal.

The angle demodulation unit may obtain the phase information as phase values of the first input signal and the second input signal before being angle-modulated based on a difference between the first input signal and the second input signal based on a phase difference value between the first input signal and the second input signal.

When the first input signal and the second input signal are phase-adjusted, angle-modulated, and subsequently transmitted, respectively, the angle demodulation unit may obtain the phase information as phase values of the first input signal and the second input signal before being angle-modulated, based on the difference between the first input signal and the second input signal, a sum of the first input signal and the second input signal, and phase-adjusted values obtained by adjusting the first input signal and the second input signal such that the phase difference value between the first input signal and the second input signal is a pre-set value, based on a phase difference value between the first input signal and the second input signal.

The first reception processing unit and the second reception processing unit, respectively, may include: a scaling unit configured to scale an input signal by using a modulation index applied from a transmitter; a signal conversion unit configured to convert the scaled signal into a parallel signal; an FFT unit configured to perform FFT on the signal in the parallel form; and a signal demapping unit configured to perform demapping on the FFT-transformed signal to demodulate it to obtain corresponding data.

Advantageous Effect

According to an embodiment of the present invention, while transmitting and receiving signals by combining an OFDM modulation scheme and an angle modulation scheme, input data are phase-adjusted and transmitted, whereby a receiver can easily separate signals.

Also, since signal separation is easily performed, an amount of transmitted data can be increased.

Further, signal transmission and reception resistant to multi-path can be performed through the OFDM modulation scheme, a PAPR can be lowered to 0 dB by combining the OFDM modulation scheme and the angle modulation scheme, and a data transfer rate can be improved.

In addition, two different transmission signals can be separated by using a single reception antenna, transmission capacity can be improved, and a reception apparatus can be easily designed and fabricated.

MODE FOR INVENTION

Figure 1:
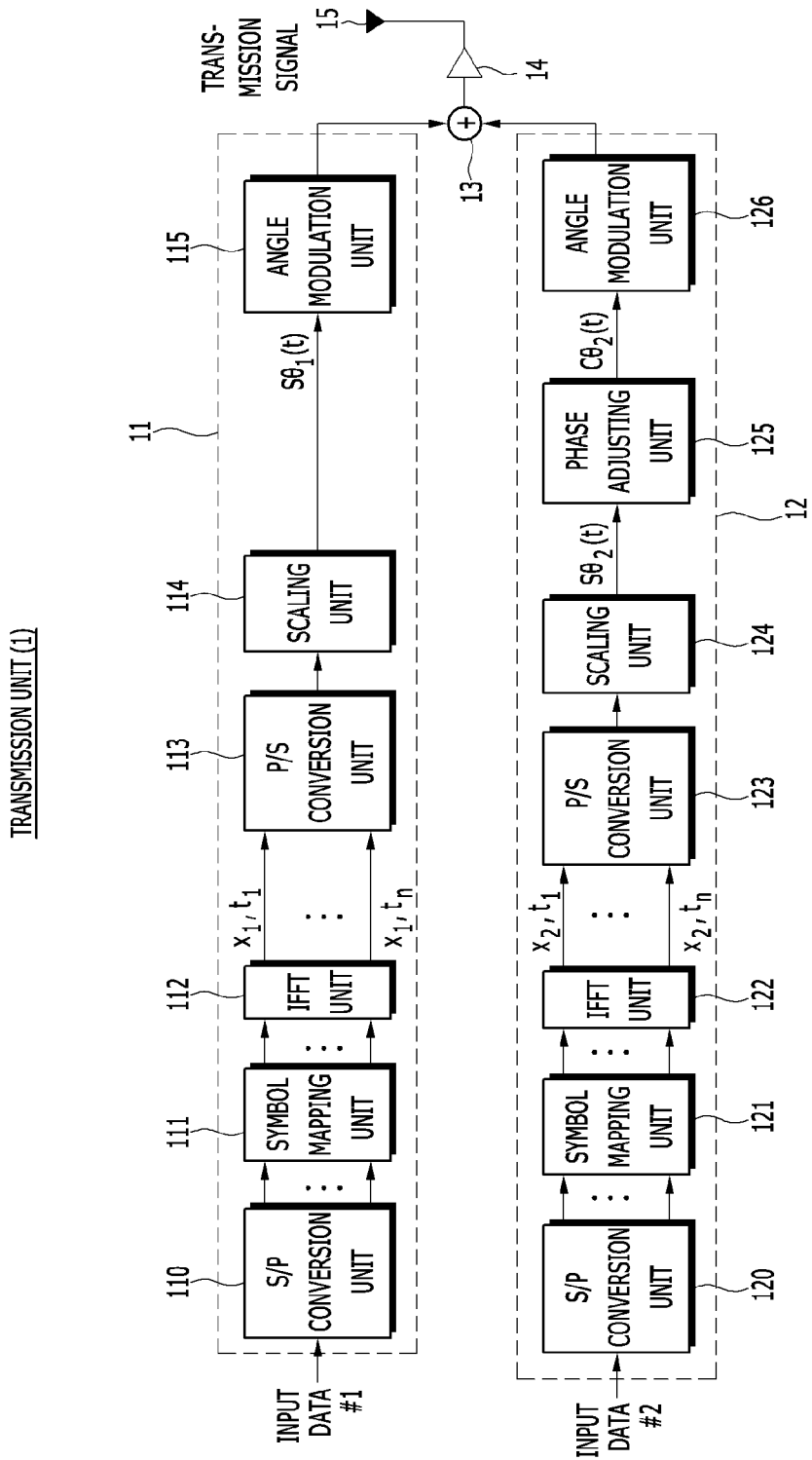
FIG. 1 is a view illustrating a structure of a transmission apparatus in a constant envelope orthogonal frequency division multiplexing (CD-OFDM) communication system according to a first embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

Hereinafter, a method and apparatus for transmitting and receiving signals according to embodiments of the present invention will be described with reference to the accompanying drawings.

FIG. 1 is a view illustrating a structure of a transmission apparatus in a constant envelope orthogonal frequency division multiplexing (CD-OFDM) communication system according to a first embodiment of the present invention.

As illustrated in FIG. 1, a transmission apparatus 1 includes a first transmission processing unit 11, a second transmission processing unit 12, a signal combining unit 13, a signal amplifying unit 14, and a transmission antenna 15.

The first transmission processing unit 11 includes a serial-to-parallel (S/P) conversion unit 110 converting input data into parallel data, a symbol mapping unit 111 mapping symbols with respect to parallel data to generate a symbol signal, an IFFT unit 111 performing inverse fast Fourier transform (IFFT) on the symbol signal, a parallel-to-serial (P/S) conversion unit 113 converting the IFFT-transformed signal into a serial signal, a scaling unit 114 scaling the serial signal, and an angle modulation unit 115 angle-modulating the scaled signal.

The second transmission processing unit 12 includes an S/P conversion unit 120 converting input data into parallel data, a symbol mapping unit 121 generating a symbol signal, an IFFT unit 122 performing IFFT on the symbol signal, a P/S conversion unit 123, a scaling unit 124, a phase adjusting unit 125 adjusting a phase of the scaled signal, and an angle modulation unit 126 angle-modulating the phase-adjusted signal.

Here, the S/P conversion units 110 and 120, the symbol mapping units 111 and 121, the IFFT units 112 and 122, and the P/S conversion units 113 and 123 en masse may be called an "OFDM modulator". The signal combining unit 13, the signal amplifying unit 14, and the transmission antenna 15 en masse may be called a "transmission unit".

The transmission apparatus 1 has a structure combining OFDM modulation and angular modulation.

Meanwhile, in the first embodiment of the present invention, the transmission apparatus 1 may be variously modified.

Figure 2:
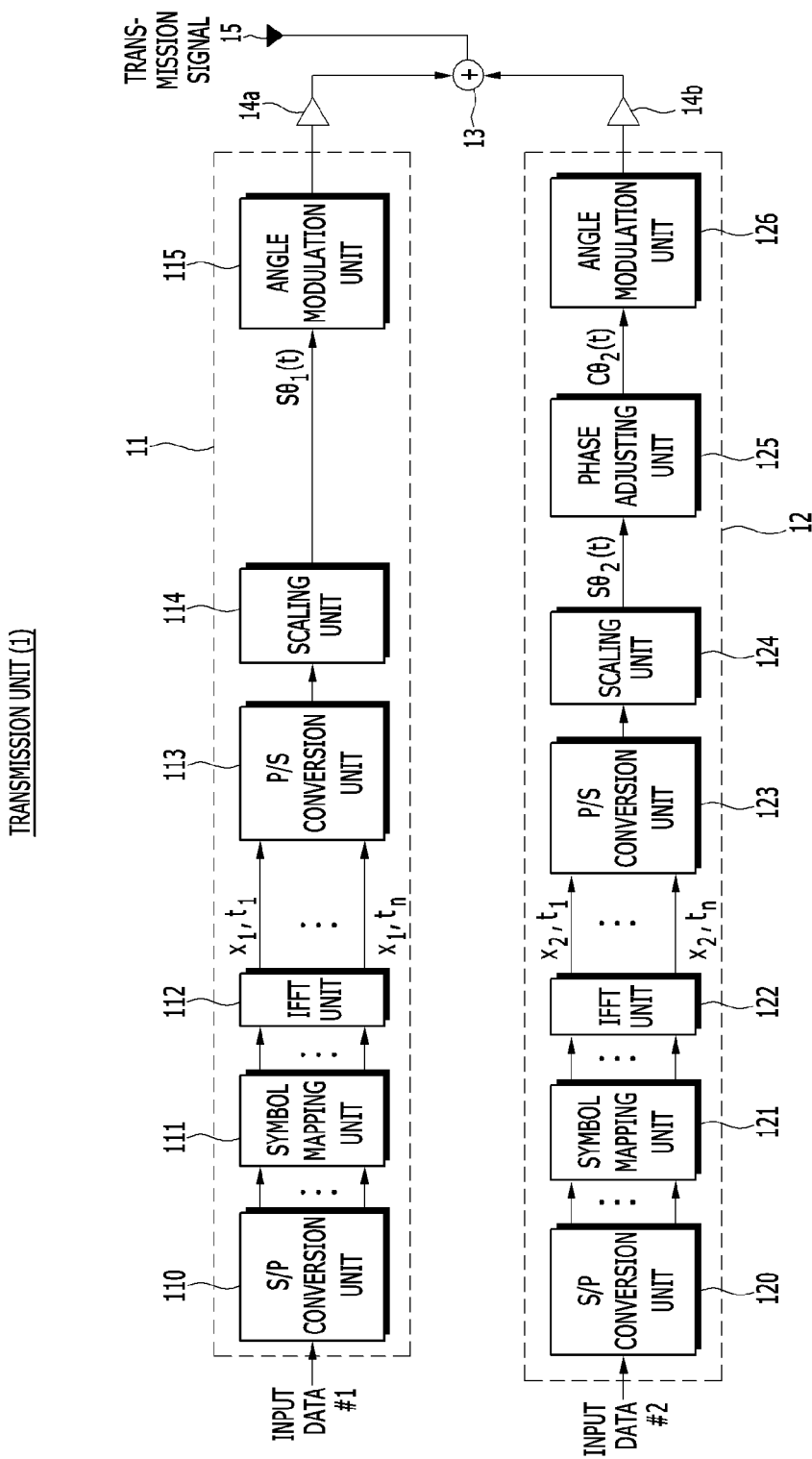
FIGS. 2 and 3 are views illustrating different structures of the transmission apparatus according to the first embodiment of the present invention.
Figure 3:
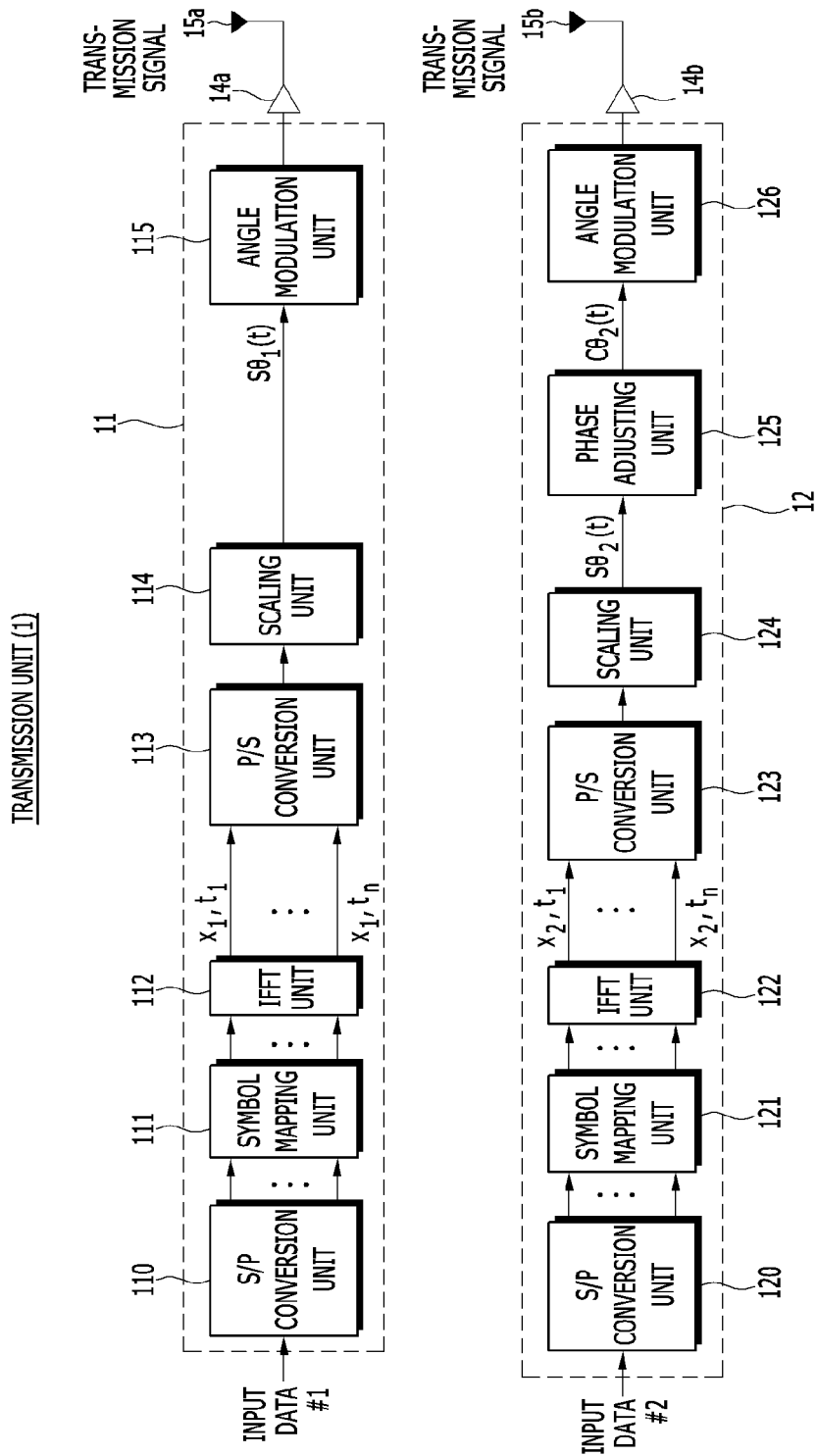

FIGS. 2 and 3 are views illustrating different structures of the transmission apparatus according to the first embodiment of the present invention.

The transmission apparatus 1 according to the first embodiment of the present invention may use two signal amplifying units. That is, as illustrated in FIG. 2, a first signal amplifying unit 14a may be connected to an output terminal of the first transmission processing unit 11, and a second signal amplifying unit 14b may be connected to the second transmission processing unit 12. The signal combining unit 13 may be connected to output terminals of the first signal amplifying unit 14a and the second signal amplifying unit 14b. In this case, the first signal amplifying unit 14a amplifies a signal processed in and output from the first transmission processing unit 11 and outputs the amplified signal, and the second signal amplifying unit 14b amplifies a signal processed in and output from the second transmission processing unit 12 and outputs the amplified signal. The signal combining unit 13 combines the signals output from the two signal amplifying units 14a and 14b and transmits the combined signal through the antenna 15.

Also, the transmission apparatus 1 according to the first embodiment of the present invention may transmit respective signals through two independent transmission antennas, without using the signal combining unit 13.

That is, as illustrated in FIG. 3, the transmission apparatus 1 may be implemented to include two transmission antennas 15a and 15b based on the structure illustrated in FIG. 2, and in this case, the signal combining unit 13 is not used. Thus, a signal output from the first signal amplifying unit 14a is transmitted through the transmission antenna 15a, and a signal output from the second signal amplifying unit 14b is transmitted through the transmission antenna 15b.

Hereinafter, a transmission method according to the first embodiment of the present invention will be described.

Figure 4:
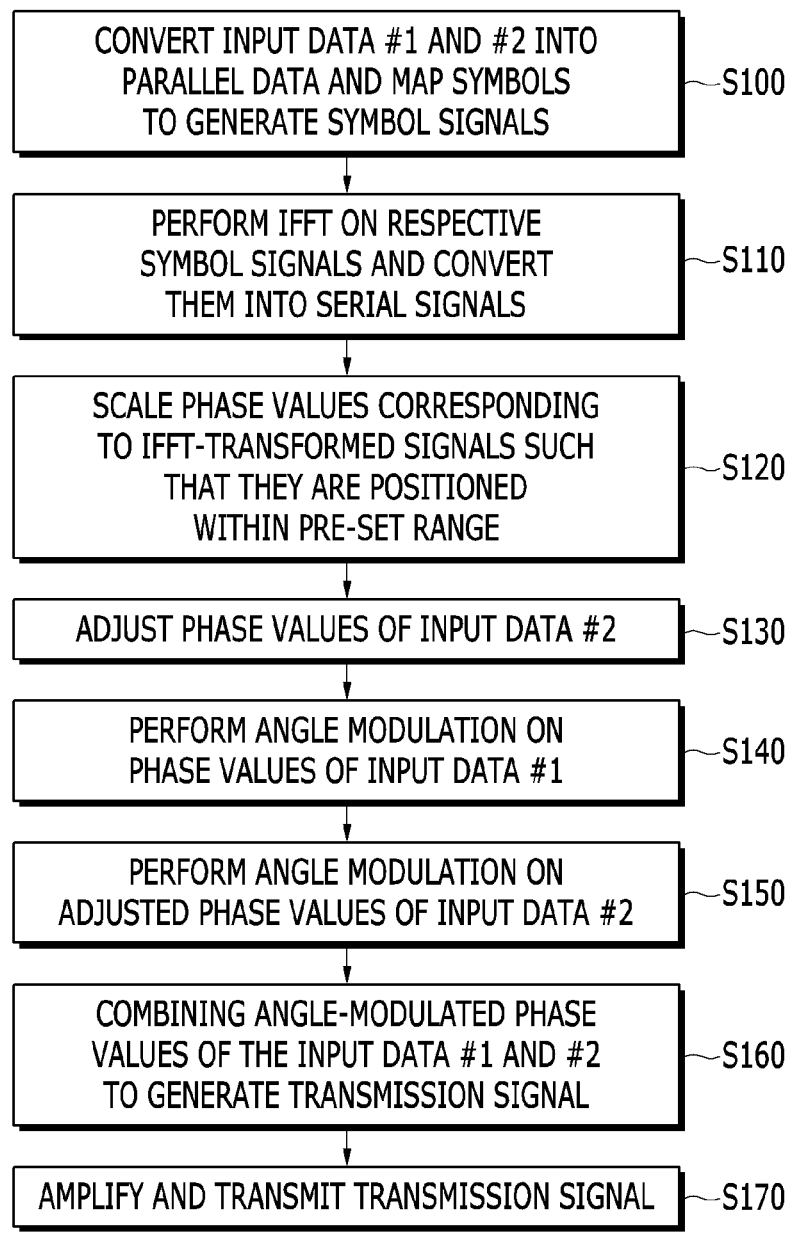
FIG. 4 is a flowchart illustrating a process of a transmission method according to the first embodiment of the present invention.
Figure 5:
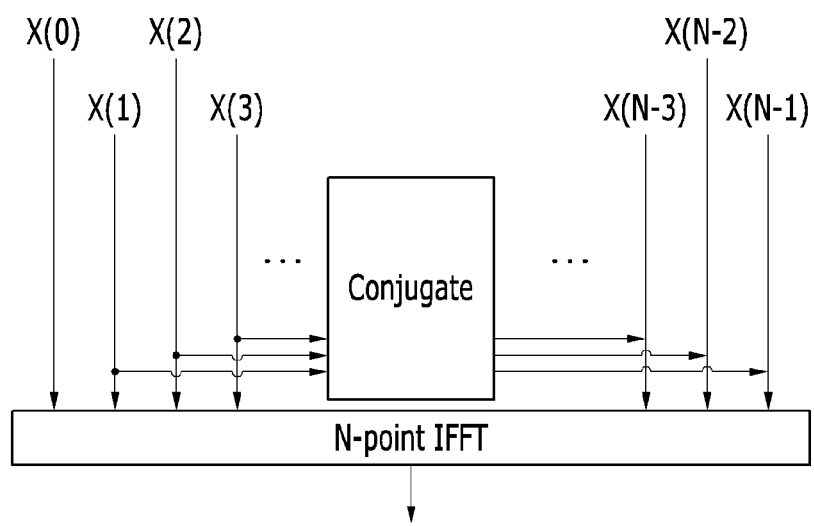
FIG. 5 is a view illustrating disposition of symbol signals desired to be transmitted.

FIG. 4 is a flowchart illustrating a process of a transmission method according to the first embodiment of the present invention, and FIG. 5 is a view illustrating disposition of symbol signals desired to be transmitted.

When bit-type data is input as serial data, the input data is processed by the first transmission processing unit 11 and the second transmission processing unit 12 such that it is transmittable. That is, input data #1 (or it may be called a "first input signal") and input data #2 (or it may be called a "second input signal") are subjected to S/P conversion, symbol mapping such as quadrature phase shift keying (QPSK), quadrature amplitude modulation, 16QAM, 64QAM, or the like, IFFT-transformed, and scaled, respectively, and a phase value of the input data #2 is adjusted. Thereafter, signals corresponding to these data are angle-modulated and combined to be processed to a transmission signal. The transmission signal is amplified, multiplied by a carrier frequency, and subsequently transmitted through a single transmission antenna.

The transmission method will be described in detail. As illustrated in FIG. 4, the input data #1 is converted into parallel data through the S/P conversion unit 110, and input to the symbol mapping unit 111. Also, the input data #2 is converted into parallel data through the S/P conversion unit 120 and input to the symbol mapping unit 121. The symbol mapping units 111 and 121 generate a symbol signal by performing modulation thereon through QPSK, 16QAM, 64QAM, or the like (S100). Here, a position of the symbol signal is as shown in FIG. 5. In FIG. 5, X(k) is a k-th symbol-mapped signal, and X 0=0. The IFFT unit 112 performs IFFT on the symbol signal and outputs a signal of a time domain.

Output signals from the symbol mapping units 111 and 121 have only a real number, rather than a complex signal. If a minus (−) sign is added to a conjugate signal and IFFT is performed thereon, the conjugate signal becomes a signal having only an imaginary number part.

For example, it is assumed that a size of IFFT is 128, an OFDM modulation scheme is 16QAM, and an output signal from the symbol mapping unit 111 is "1+j, 3+3×j, −1−j, ...,". In order to allow the symbol mapping unit 111 to have only a real number value in an output signal, symbols may be disposed in the structure as shown in FIG. 5 as follows.

$$X(0)=0, X(1)=1+j, X(2)=3+3\times j, X(3)=-1-j, \ldots, X(64)=0, \ldots, X(125)=-1+j, X(126)=3-3\times j, X(127)=1-j \quad \text{(Equation 1)}$$

The symbol signal disposed as shown in Equation 1 is input to the IFFT units 112 and 122, and the symbol signal is IFFT-transformed so as to be transmitted through a time axis, converted into a serial signal through the P/S conversion units 113 and 123, and subsequently input to the scaling units 114 and 124 (S110). The scaling units 114 and 124 scale the input signal such that it is positioned within a pre-set range, and output the same.

It is assumed that an output signal of the IFFT unit 112 with respect to the input data #1 is $X_{1,t1}, X_{1,t2}, \ldots, X_{1,tn}$, and an output signal of the IFFT unit 122 with respect to the input data #2 is $X_{2,t1}, X_{2,t2}, \ldots, X_{2,tn}$. Here, the output signals of the IFFT units 112 and 122 are phase values for angle modulation. Thus, the IFFT output signal of the input data #1, i.e., a phase value, is expressed as θ1(t), and the IFFT output signal of the input data #2, i.e., a phase value, is expressed as θ2(t). Individual phase values constituting the IFFT output signal of the input data #1 may be expressed as θ1 $t_1$, θ1 $t_2$, θ1 $t_3$, θ1 $t_4$, ..., θ1($t_n$), and individual phase values constituting the IFFT output signal of the input data #2 may be expressed as θ2 $t_1$, θ2 $t_2$, θ2 $t_3$, θ2 $t_4$, ..., θ2($t_n$), and here "n" indicates a size of IFFT.

The scaling units 114 and 124 scale the phase values such that the angle phase values are positioned within a first pre-set range (S120).

In detail, the scaling units 114 and 124 perform scaling such that the phase values θ1($t_1$), θ1($t_2$), θ1($t_3$), θ1($t_4$), ..., θ1($t_n$) with respect to the input data #1 and the phase values θ2($t_1$), θ2($t_2$), θ2($t_3$), θ2($t_4$), ..., θ2($t_n$) with respect to the input data #2 are positioned within the first pre-set range, i.e., a range from −π/4 to π/4.

In an embodiment of the present invention, the scaled phase values with respect to the input data #1 are expressed as Sθ1($t_1$), Sθ1($t_2$), Sθ1($t_3$), Sθ1($t_4$), ..., Sθ1($t_n$), and scaled phase values with respect to the input data #2 are expressed as Sθ2($t_1$), Sθ2($t_2$), Sθ2($t_3$), Sθ2($t_4$), ..., Sθ2($t_n$). Here, the scaled values are called angle modulation indices (m).

Meanwhile, the scaled phase values with respect to the input data #1 output from the scaling unit 114 are input to the angle modulation unit 115, and scaled phase values with respect to the input data #2 are input to the phase adjusting unit 125.

The phase adjusting unit 125 performs phase adjustment on the input data #2 such that a receiver may be able to separate the input data #1 and the input data #2 (S130). That is, the phase adjusting unit 125 adjusts the scaled phase values with respect to the input data #2 as shown in Equation 2 below, and makes a phase difference from the scaled phase values with respect to the input data #1 the pre-set value, i.e., π/2.

$$a\times\{S\theta2(t_1), S\theta2(t_2), S\theta2(t_3), S\theta2(t_4), \ldots, S\theta2(t_n)\} + b\times\frac{\pi}{2} \quad \text{(Equation 2)}$$

Here, the phase adjusted values are a=±1 and b=±1, and here, a and b values may be arbitrarily selected by ones. The phase-adjusted scaled phase values with respect to the input data #2 may be expressed as Cθ2($t_1$), Cθ2($t_2$), Cθ2($t_3$), Cθ2($t_4$), ..., Cθ2($t_n$).

Meanwhile, the angle modulation units 115 and 126 perform angle modulation on input signals, and convert the respective individual phase values as shown in Equation 3 below.

$$\text{Cos(respective indivisual phase values)} + j\times\text{sin(respective individual phase values)} \quad \text{(Equation 3)}$$

The angle modulation unit 115 obtains cos(Sθ($t_1$), Sθ($t_2$), ..., Sθ($t_n$)) and sin(Sθ($t_1$), Sθ($t_2$), ..., Sθ($t_n$)) based on the scaled phase values with respect to the input data #1 output from the scaling unit 114 (S140), and these values may be simply expressed by the following matrix.

$$\cos(S\theta(t_1), S\theta(t_2), \ldots, S\theta(t_n)) = [\cos(S\theta(t_1)), \cos(S\theta(t_2)), \ldots, \cos(S\theta(t_n))]$$

$$\sin(S\theta(t_1), S\theta(t_2), \ldots, S\theta(t_n)) = [\sin(S\theta(t_1)), \sin(S\theta(t_2)), \ldots, \sin(S\theta(t_n))] \quad \text{(Equation 4)}$$

Based on the matrix, the scaled phase values with respect to the input data #1 may be converted according to Equation 3 and expressed as follows.

$$\cos(S\theta1(t_1), S\theta1(t_2), S\theta1(t_3), S\theta1(t_4), \ldots, S\theta1(t_n)) + j\times\sin(S\theta1(t_1), S\theta1(t_2), S\theta1(t_3), S\theta1(t_4), \ldots, S\theta1(t_n)) \quad \text{(Equation 5)}$$

Meanwhile, Equation 5 may be generalized by Equation 6 shown below.

$$c\times\{\cos(S\theta1(t_1), S\theta1(t_2), S\theta1(t_3), S\theta1(t_4), \ldots, S\theta1(t_n))\} + d\times\{j\times\sin(S\theta1(t_1), S\theta1(t_2), S\theta1(t_3), S\theta1(t_4), \ldots, S\theta1(t_n))\} \quad \text{(Equation 6)}$$

Here, c=±1 and d=±1, and c and d values may be arbitrarily selected by ones.

Meanwhile, the angle modulation unit 126 performs angle modulation on the scaled and adjusted phase values with respect to the input data #2 output from the phase adjusting unit 125. That is, the scaled and adjusted phase values with respect to the input data #2 may be converted based on Equation 3 to obtain values as shown in Equation 7 below.

$$\cos(C\theta2(t_1), C\theta2(t_2), C\theta2(t_3), C\theta2(t_4), \ldots, C\theta2(t_n)) + j\times\sin(C\theta2(t_1), C\theta2(t_2), C\theta2(t_3), C\theta2(t_4), \ldots, C\theta2(t_n)) \quad \text{(Equation 7)}$$

The angle-modulated phase values with respect to the input data #2 as expressed in Equation 7 may be variously expressed in consideration of the phase adjusted values a and b as follows.

First, in case that a=1 and b=1, the angle-modulated phase values with respect to the input data #2 may be expressed as shown in Equation 8.

$$-\sin(S\theta2(t_1),S\theta2(t_2),S\theta2(t_3),S\theta2(t_4),\ldots,S\theta2(t_n))+j\times \cos(S\theta2(t_1),S\theta2(t_2),S\theta2(t_3),S\theta2(t_4),\ldots,S\theta2(t_n)) \quad \text{(Equation 8)}$$

Also, in the case that a=1 and b=−1, the angle-modulated phase values with respect to the input data #2 may be expressed as show in Equation 9.

$$\sin(S\theta2(t_1),S\theta2(t_2),S\theta2(t_3),S\theta2(t_4),\ldots,S\theta2(t_n))- j\times\cos(S\theta2(t_1),S\theta2(t_2),S\theta2(t_3),S\theta2(t_4),\ldots,S\theta2(t_n)) \quad \text{(Equation 9)}$$

Also, in the case that a=−1 and b=1, the angle-modulated phase values with respect to the input data #2 may be expressed as shown in Equation 10.

$$\sin(S\theta2(t_1),S\theta2(t_2),S\theta2(t_3),S\theta2(t_4),\ldots,S\theta2(t_n))+ j\times\cos(S\theta2(t_1),S\theta2(t_2),S\theta2(t_3),S\theta2(t_4),\ldots,S\theta2(t_n)) \quad \text{(Equation 10)}$$

Also, in the case that a=−1 and b=−1, the angle-modulated phase values with respect to the input data #2 may be expressed as shown in Equation 11.

$$-\sin(S\theta2(t_1),S\theta2(t_2),S\theta2(t_3),S\theta2(t_4),\ldots,S\theta2(t_n))-j\times \cos(S\theta2(t_1),S\theta2(t_2),S\theta2(t_3),S\theta2(t_4),\ldots,S\theta2(t_n)) \quad \text{(Equation 11)}$$

As described above, the signals angle-modulated and output through the angle modulation units 115 and 126 are input to the signal combining unit 13. The signal combining unit 13 combines the angle-modulated phase values with respect to the signal, i.e., the input data #1, output from the angle modulation unit 115, and the angle-modulated phase phases with respect to the signal, i.e., the input data #2 output through the angle modulation unit 126, and outputs the same as a transmission signal (S160).

In this case, the signal corresponding to Equation 6 shown above and the signal corresponding to one of Equation 7 to Equation 11 are combined and output as a transmission signal. Table 1 below shows cases of combining signals.

TABLE 1

| Case | Combining signals |
|---|---|
| 1 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) |
| 2 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) |
| 3 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) |
| 4 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) |
| 5 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) |
| 6 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) |
| 7 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) − |
| 8 | cos(S$\theta$1(t$_1$), (S$\theta$1(t$_2$), (S$\theta$1(t$_3$), (S$\theta$1(t$_4$), . . . , S$\theta$1(t$_n$)) + j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) |
| 9 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) |
| 10 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) |
| 11 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) |
| 12 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) − |
| 13 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) − |
| 14 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) − |
| 15 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) + sin(S$\theta$2(t$_1$), (S$\theta$2(t$_2$), (S$\theta$2(t$_3$), (S$\theta$2(t$_4$), . . . , S$\theta$2(t$_n$)) + j × cos(S$\theta$2(t$_1$), (S$\theta$2(t$_2$), (S$\theta$2(t$_3$), (S$\theta$2(t$_4$), . . . , S$\theta$2(t$_n$)) − |
| 16 | cos(S$\theta$1(t$_1$), (S$\theta$1(t$_2$), (S$\theta$1(t$_3$), (S$\theta$1(t$_4$), . . . , S$\theta$1(t$_n$)) − j × sin(S$\theta$1(t$_1$), (S$\theta$1(t$_2$), (S$\theta$1(t$_3$), (S$\theta$1(t$_4$), . . . , S$\theta$1(t$_n$)) − sin(S$\theta$2(t$_1$), (S$\theta$2(t$_2$), (S$\theta$2(t$_3$), (S$\theta$2(t$_4$), . . . , S$\theta$2(t$_n$)) − j × cos(S$\theta$2(t$_1$), (S$\theta$2(t$_2$), (S$\theta$2(t$_3$), (S$\theta$2(t$_4$), . . . , S$\theta$2(t$_n$)) |

The signal corresponding to Equation 6 and signals corresponding to one of Equation 7 to Equation 11 are combined with one of the plurality of cases as shown in Table 1 and output as a transmission signal. The transmission signal is amplified through the signal amplifying unit 14, and subsequently transmitted through the antenna 15 (S170).

Here, when the transmission apparatus 1 includes two signal amplifying units as shown in FIG. 2, the signal corresponding to Equation 6 and the signal corresponding to one of Equation 7 to Equation 11 may be amplified, combined, and subsequently transmitted through the antenna 15. Also, when the transmission apparatus 1 includes two transmission antennas as illustrated in FIG. 3, the signal corresponding to Equation 6 above and the signal corresponding to one of Equation 7 to Equation 11 above may be amplified, respectively, and subsequently transmitted through respective transmission antennas.

Hereinafter, a reception apparatus and a reception method according to the first embodiment of the present invention will be described.

Figure 6:
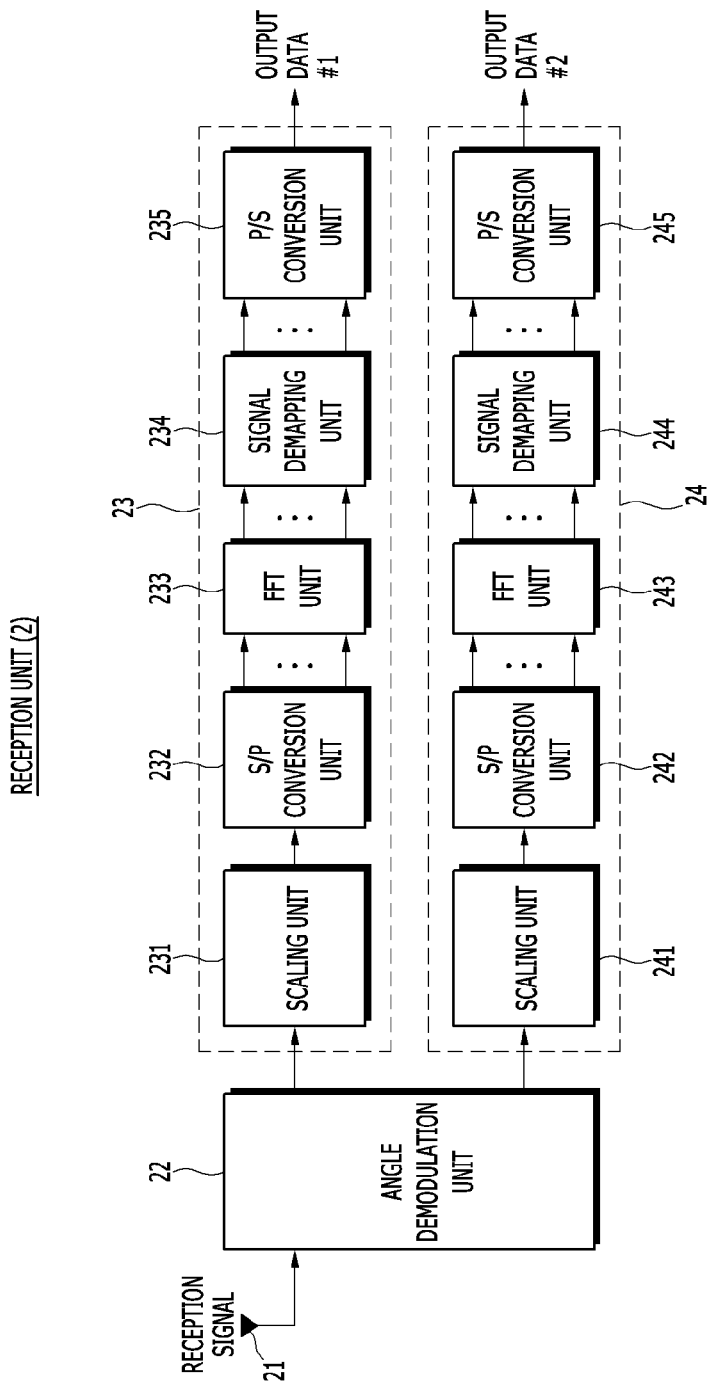
FIG. 6 is a view illustrating a structure of a reception apparatus in the CD-OFDM communication system according to the first embodiment of the present invention.

FIG. 6 is a view illustrating a structure of a reception apparatus in the CD-OFDM communication system according to the first embodiment of the present invention.

As illustrated in FIG. 6, a reception apparatus 2 according to the first embodiment of the present invention includes a reception antenna 21, an angle demodulation unit 22, a first reception processing unit 23, and a second reception processing unit 24.

The reception antenna 21 receives a signal transmitted from the transmission apparatus 1, and the angle demodulation unit 22 separates a first reception signal and a second reception signal from reception signals and outputs them.

The first reception processing unit 23 includes a scaling unit 231 scaling the first reception signal input from the angle demodulation unit 22 and outputting the same, an S/P conversion unit 232 outputting the scaled first reception signal in a parallel form, an FFT unit 233 performing FFT on the first reception signal in the parallel form and outputting a signal of a frequency domain, a demapping unit 234 demodulating the FFT-transformed first reception signal and outputting the same, and a P/S conversion unit 235 converting the demodulated output signal into a serial signal and outputting input data #1 as original information.

The second reception processing unit 24 includes a scaling unit 241 scaling the second reception signal input from the angle demodulation unit 22 and outputting the same, an S/P conversion unit 242 outputting the scaled second reception signal in a parallel form, an FFT unit 243 performing FFT on the second reception signal in the parallel form and outputting a signal of a frequency domain, a demapping unit 244 demodulating the FFT-transformed second reception signal and outputting the same, and a P/S conversion unit 245 converting the demodulated output signal into a serial signal and outputting input data #2 as original information.

Here, the S/P conversion units 232 and 242, the signal demapping units 233 and 234, the FFT units 234 and 244, and the P/S conversion units 235 and 245 en masse may be called an "OFDM demodulator".

Figure 7:
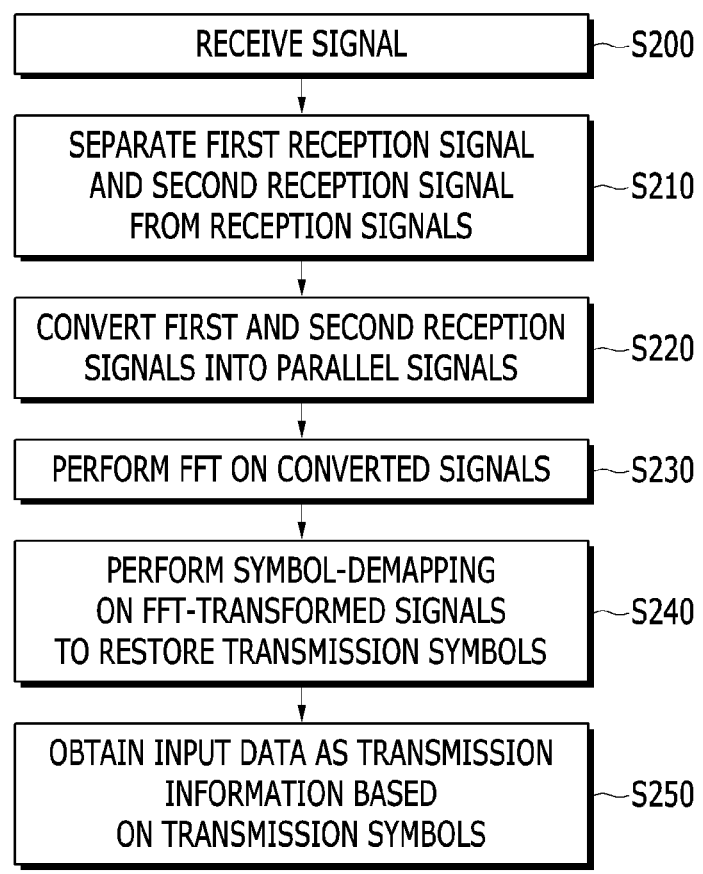
FIG. 7 is a flowchart illustrating a process of a reception method according to the first embodiment of the present invention.

FIG. 7 is a flowchart illustrating a process of a reception method according to the first embodiment of the present invention.

The reception apparatus 2 receives signals transmitted from the transmission apparatus 1, and in this case, the reception signals are signals to which signals obtained by angle-modulating the input data #1 and the input data #2 have been added (S200). The reception apparatus 2 separates a first reception signal corresponding to the input data #1 and a second reception signal corresponding to the input data #2 (S210).

In an embodiment of the present invention, the first reception signal and the second reception signal are separated from the reception signals based on phase information as phase values before being angle-modulated in the transmission apparatus.

In this case, if the reception apparatus 2 knows signals mutually subtracted with respect to the angle-modulated signals in the input data #1 and the input data #2, the reception apparatus 2 may be able to separate angle-modulated signals from the reception signals.

In order to simplify formula expression, when a signal of the input data #1 after being angle-modulated is P (refer to Equation 6 above) and a signal of the input data #2 after being angle-modulated is M (refer to Equation 8 to Equation 11 above) in the transmission apparatus 1, a signal transmitted from the transmission apparatus 1 may be expressed as a P+M signal.

Here, an absolute value of P−M signal may be expressed as follows.

$$|P-M| = \sqrt{4 - |P+M|^2}$$ (Equation 12)

A phase difference value, i.e., $\angle(P-M) - \angle(P+M)$, between the two signals is as shown in Table 2 below.

TABLE 2

| a | b | c | d | $\angle(P-M) - \angle(P+M)$ |
|---|---|---|---|---|
| 1 | 1 | 1 | 1 | $-\frac{\pi}{2}$ |
| 1 | −1 | 1 | 1 | $\frac{\pi}{2}$ |
| −1 | 1 | 1 | 1 | $-\frac{\pi}{2}$ |
| −1 | −1 | 1 | 1 | $\frac{\pi}{2}$ |
| 1 | 1 | −1 | 1 | $-\frac{3\times\pi}{2}$ |
| 1 | −1 | −1 | 1 | $\frac{3\times\pi}{2}$ |
| −1 | 1 | −1 | 1 | $-\frac{3\times\pi}{2}$ |
| −1 | −1 | −1 | 1 | $\frac{3\times\pi}{2}$ |
| 1 | 1 | 1 | −1 | $-\frac{\pi}{2}$ |
| 1 | −1 | 1 | −1 | $\frac{\pi}{2}$ |
| −1 | 1 | 1 | −1 | $-\frac{\pi}{2}$ |
| −1 | −1 | 1 | −1 | $\frac{\pi}{2}$ |
| 1 | 1 | −1 | −1 | $-\frac{3\times\pi}{2}$ |
| 1 | −1 | −1 | −1 | $\frac{3\times\pi}{2}$ |
| −1 | 1 | −1 | −1 | $-\frac{3\times\pi}{2}$ |
| −1 | −1 | −1 | −1 | $\frac{3\times\pi}{2}$ |

P−M may be obtained by using Equation 12 and Table 2. Here, a, b, c, and d indicate values selected in the angle modulation units 115 and 126 of the transmission apparatus 1. Phase information ($S\theta1(t_1)$, $S\theta1(t_2)$, $S\theta1(t_3)$, $S\theta1(t_4)$, ..., $S\theta1(t_n)$) as phase values with respect to the input data #1 before being angle-modulated in the transmission apparatus may be expressed as follows by adding (P+M) and (P−M) to obtain an addition value, and applying c and d to a value($\hat{P}$)

obtained by dividing the addition value by 2.

$$\angle \frac{d \times \text{Im}[\hat{P}]}{c \times \text{Re}[\hat{P}]} \qquad \text{(Equation 13)}$$

Also, phase information ($S\theta2(t_1)$, $S\theta2(t_2)$, $S\theta2(t_3)$, $S\theta2(t_4)$, ..., $S\theta2(t_n)$) as phase values with respect to the input data #2 before being angle-modulated in the transmission apparatus may be expressed as follows by subtracting (P−M) from (P+M) to obtain a subtraction value and applying a and b to a value($\hat{M}$)

obtained dividing the subtraction value by 2.

$$a \times \left\{ \frac{\text{Im}[\hat{M}]}{\text{Re}[\hat{M}]} - b \times \frac{\pi}{2} \right\} \qquad \text{(Equation 14)}$$

By using the phase information with respect to the reception signals before being angle-modulated in the transmission apparatus, the first reception signal corresponding to the input data #1 and the second reception signal corresponding to the input data #2 may be separated.

Meanwhile, unlike the foregoing method, the first reception signal and the second reception signal may be separated from the reception signals.

In detail, a k-th individual phase value ($S\theta1(t_k)$) of input data #1 and a k-th individual phase value ($S\theta2(t_k)$) of the input data #2 transmitted from the transmission apparatus 1 may be expressed as follows.

$$S\theta1(t_k) = \angle \frac{\sin(S\theta1(t_k))}{\cos(S\theta1(t_k))} \qquad \text{(Equation 15)}$$

$$S\theta2(t_k) = \angle \frac{\sin(S\theta2(t_k))}{\cos(S\theta2(t_k))}$$

Figure 8:
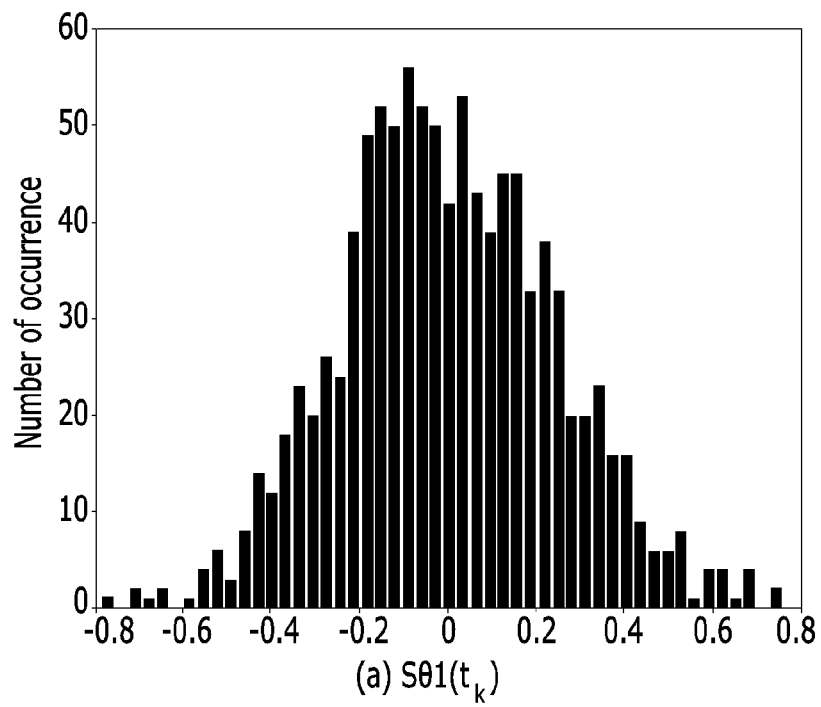
FIG. 8 is a graph showing Gaussian distribution characteristics of input data according to the first embodiment of the present invention.
Figure 8:
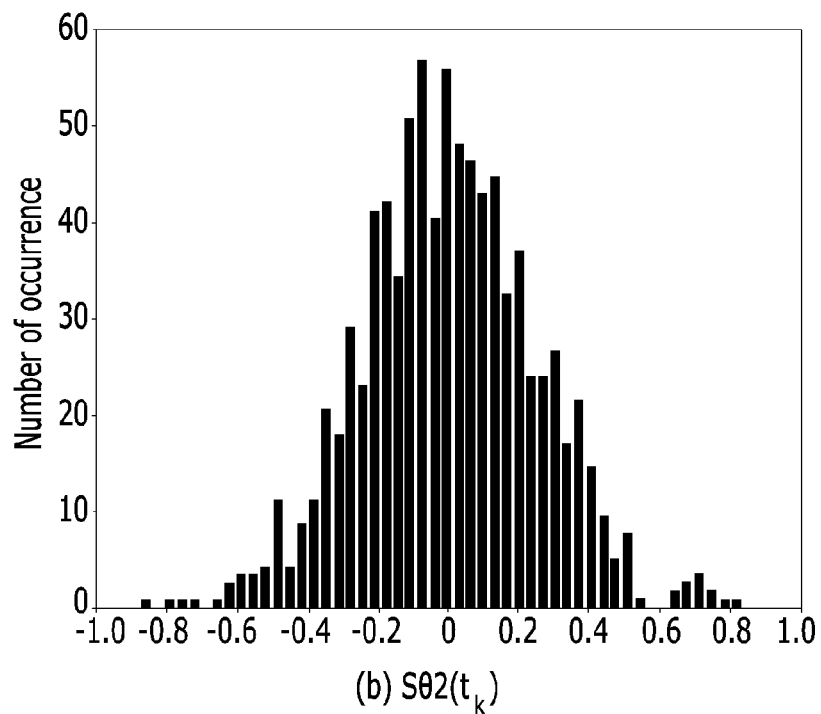
Figure 9:
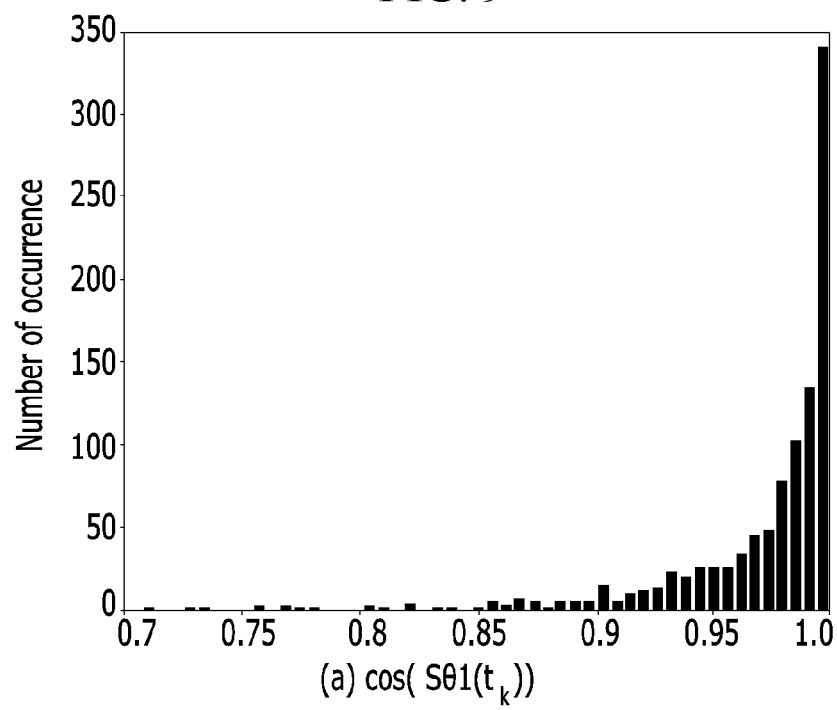
FIG. 9 is a graph showing the characteristics of phase values cos (S$\theta$1($t_k$)) and cos (S$\theta$2($t_k$)) according to the first embodiment of the present invention, and FIG. 10 a graph showing the characteristics of phase values (sin(S$\theta$1 ($t_k$)) and sin (S$\theta$2($t_k$)) according to the first embodiment of the present invention.
Figure 9:
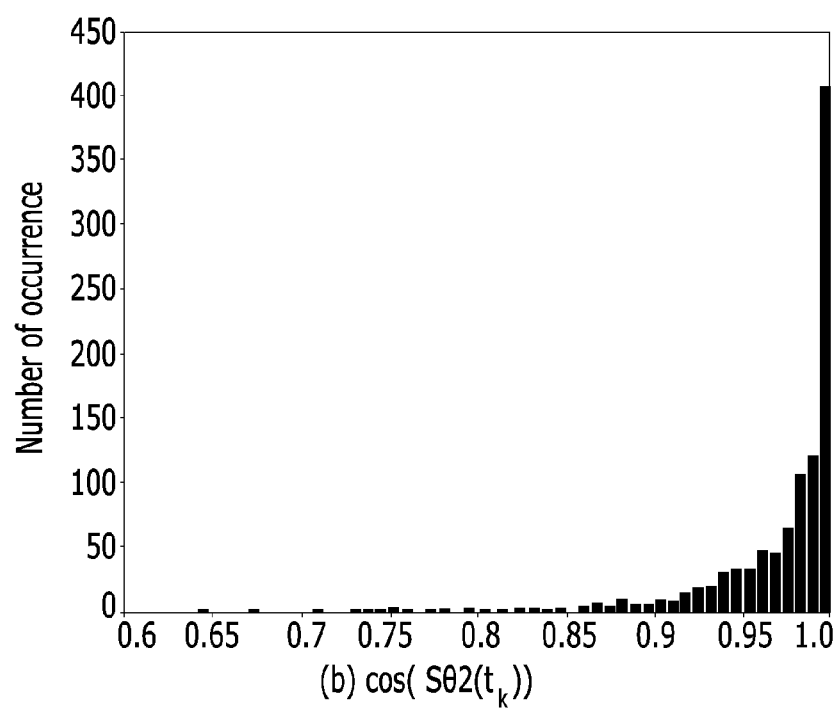

$S\theta1(t_k)$ and $S\theta2(t_k)$ have statistical characteristics, that is, Gaussian distribution characteristics as shown in FIG. 8. FIG. 8 is a graph showing Gaussian distribution characteristics of input data. Specifically, (a) in FIG. 8 is a graph showing Gaussian distribution characteristics of the k-th individual phase value ($S\theta1(t_k)$) of the input data #1 and (b) in FIG. 8 is a graph showing Gaussian distribution characteristics of the k-th individual phase value ($S\theta2(t_k)$) of the input data #2. FIG. 9 is a graph showing the characteristics of phase values cos ($S\theta1(t_k)$) and cos($S\theta2(t_k)$) according to the first embodiment of the present invention, and FIG. 10 a graph showing the characteristics of phase values sin($S\theta1(t_k)$) and sin($S\theta2(t_k)$) according to the first embodiment of the present invention.

Figure 10:
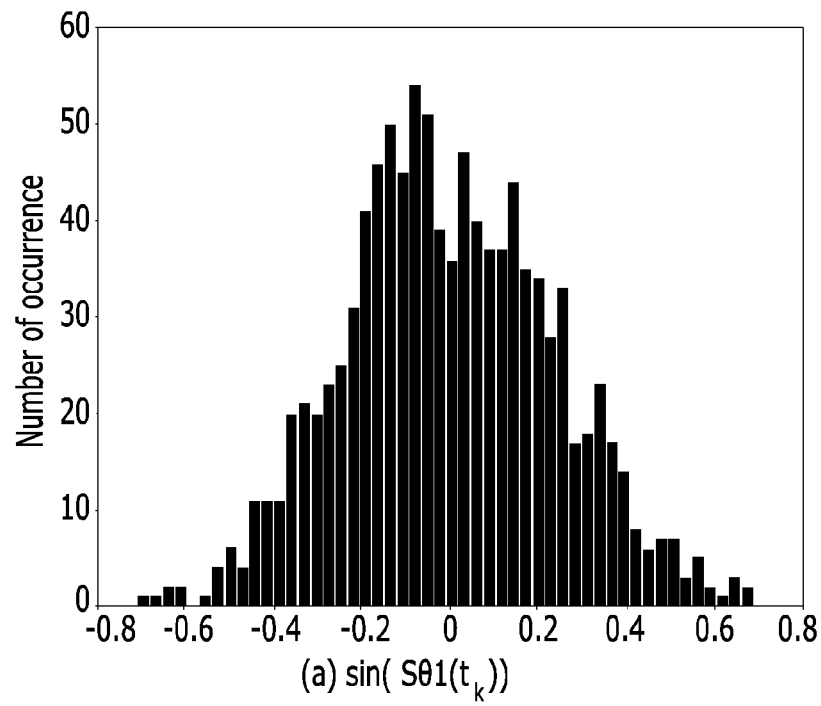
Figure 10:
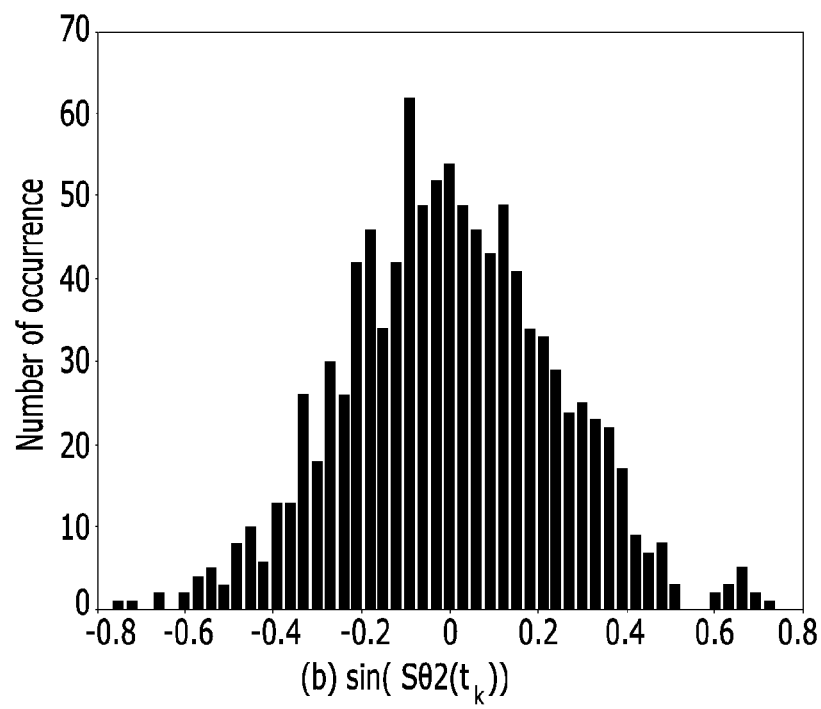

Also, in Equation 15, sin($S\theta1(t_k)$) and sin($S\theta2(t_k)$) have Gaussian distributions similar to those of $S\theta1(t_k)$ and $S\theta2(t_k)$ as shown in FIG. 10. cos($S\theta1(t_k)$) and cos($S\theta2(t_k)$) have characteristics that their values are near 1. That is, the range of fluctuation of cos($S\theta1(t_k)$) and cos($S\theta2(t_k)$) is very small relative to sin($S\theta1(t_k)$) and sin($S\theta2(t_k)$).

Based on such characteristics, it may be approximated such that cos($S\theta1(t_k)$)≈mean[Re[P+M]] and cos($S\theta2(t_k)$)≈mean[Im[P+M]]. Also, when it is assumed that θ1 and θ2 are close to 0, the following relational expression can be obtained by using the distribution characteristics illustrated in FIGS. 8 to 10.

$$S\theta1(t_k) \approx \sin(S\theta1(t_k))$$

$$S\theta2(t_k) \approx \sin(S\theta2(t_k)) \qquad \text{(Equation 16)}$$

By using such statistical characteristics, the k-th individual phase value $S\theta1(t_k)$ of the input data #1 and the k-th individual phase value of the input data #2 may be separated from the reception signals as follows.

$$\begin{aligned} \sin(S\theta1(t_k)) &= \frac{1}{d}\left[ \left(\frac{1}{ab}(\text{mean}(\text{Re}[P+M])) - \text{Re}[P_k+M_k]\right) \right] \\ \cos(S\theta1(t_k)) &= \cos\left(\frac{\frac{1}{d}\text{Im}[P_k+M_k] -}{b \cdot \text{mean}(\text{Im}[P+M])}\right) \\ \sin(S\theta2(t_k)) &= \frac{1}{ab}\left[ c\cos\left(\frac{\frac{1}{d}\text{Im}[P_k+M_k] -}{b \cdot \text{mean}(\text{Im}[P+M])}\right) - \text{Re}[P_k+M_k]\right] \\ \cos(S\theta2(t_k)) &= \cos\left(\frac{1}{ab}\left(\frac{\text{mean}(\text{Re}[P+M]) -}{\text{Re}[P_k+M_k]}\right)\right) \end{aligned} \qquad \text{(Equation 17)}$$

Here, it is satisfied that $P_k = c \times \cos(S\theta1(t_k)) + d \times j \times \sin(S\theta1(t_k))$ $M_k = -a \times b \times \sin(S\theta2(t_k)) + j \times b \times \cos(S\theta2(t_k))$. Here, a, b, c, and d indicate values selected in the angle modulation units 115 and 126 of the transmission apparatus.

$S\theta1(t_k)$ and $S\theta2(t_k)$ may be finally obtained by using Equation 17 as follows.

$$S\theta1(t_k) = \angle \frac{\sin(S\theta1(t_k))}{\cos(S\theta1(t_k))} \qquad \text{(Equation 18)}$$

$$S\theta2(t_k) = \angle \frac{\sin(S\theta2(t_k))}{\cos(S\theta2(t_k))}$$

The first reception signal ($S\theta1(t_k)$) corresponding to the input data #1 and the second reception signal ($S\theta2(t_k)$) corresponding to the input data #2 are separated from the reception signals.

Through the foregoing methods, the angle demodulation unit 22 separates the first reception signal and the second reception signal from the reception signals and outputs them, and in this case, the first reception signal is input to the first reception processing unit 23 and the second reception signal is input to the second reception processing unit 24.

The first reception signal and the second reception signal input to the respective reception processing units 23 and 24 are first phase-adjusted by the scaling units 231 and 241. In detail, the scaling units 231 and 241 apply a modulation index (m), which was applied in the transmission apparatus 1, to the input signals, respectively. That is, the scaling units 231 and 241 divide the first reception signal as a phase estimation value corresponding to the input data #1 calculated in the angle demodulation unit 21 by the modulation index (m), and divide the second reception signal as a phase estimation value corresponding to the input data #2 calculated in the angle demodulation unit 21 by the modulation index (m).

Thereafter, the scaled first and second reception signals are converted into parallel signals by the S/P conversion units 232 and 242 for FFT transformation (S220), and the FFT units 232 and 242 perform FFT on the converted parallel signals to convert them into signals of a frequency domain (S230).

Thereafter, the signal demapping units 233 and 234 perform demapping on the FFT-transformed signals of the frequency domain to restore transmission symbols (S240). The P/S conversion units 234 and 244 convert the restored transmission symbols into serial form to obtain the input data #1 and the input data #2 as the original information (S250).

Hereinafter, a method and apparatus for transmitting and receiving signals according to a second embodiment of the present invention will be described.

Figure 11:
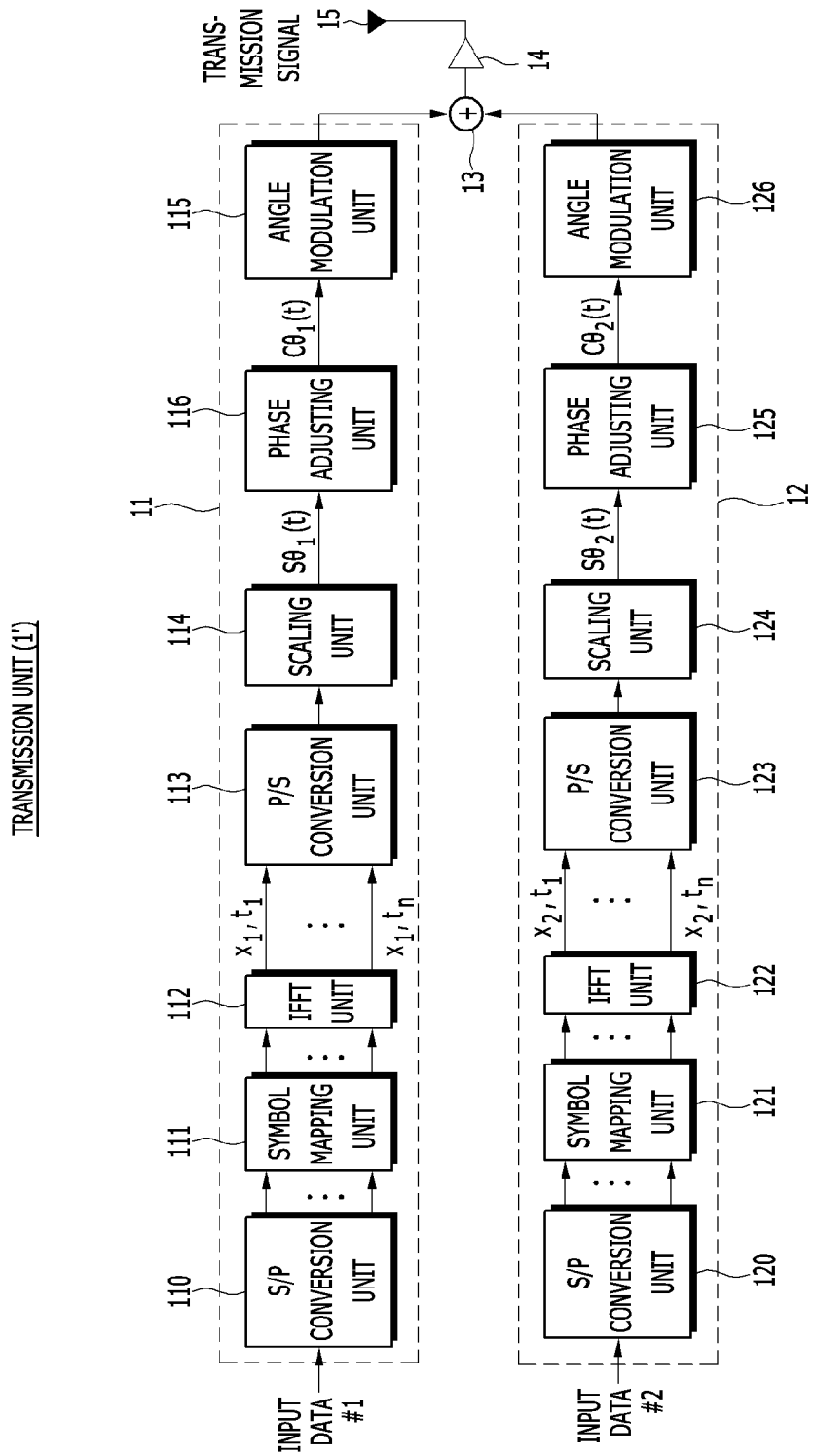
FIG. 11 is a view illustrating a structure of a transmission apparatus according to a second embodiment of the present invention.

FIG. 11 is a view illustrating a structure of a transmission apparatus 1' according to a second embodiment of the present invention.

As illustrated in FIG. 11, a transmission apparatus 1' according to the second embodiment of the present invention includes a first transmission processing unit 11', a second transmission processing unit 12, a signal combining unit 13, a signal amplifying unit 14, and a transmission antenna 15.

Like the first embodiment, the first transmission processing unit 11' includes an S/P conversion unit 110, a symbol mapping unit 111, an IFFT unit 112, a P/S conversion unit 113, a scaling unit 114, and an angle modulation unit 115. However, unlike the first embodiment, the first transmission apparatus 11' according to the second embodiment of the present invention further includes a phase adjusting unit 116 between the scaling unit 114 and the angle modulation unit 115.

The phase adjusting unit 115 performs phase adjustment on a signal scaled in and output from the scaling unit 114. This will be described in detail later.

Like the first embodiment, the second transmission processing unit 12 includes the S/P conversion unit 120, the symbol mapping unit 121, the IFFT unit 122, the P/S conversion unit 123, the scaling unit 124, the phase adjusting unit 125, and the angle modulation unit 126.

Meanwhile, the transmission apparatus 1' according to the second embodiment of the present invention may be variously modified.

Figure 12:
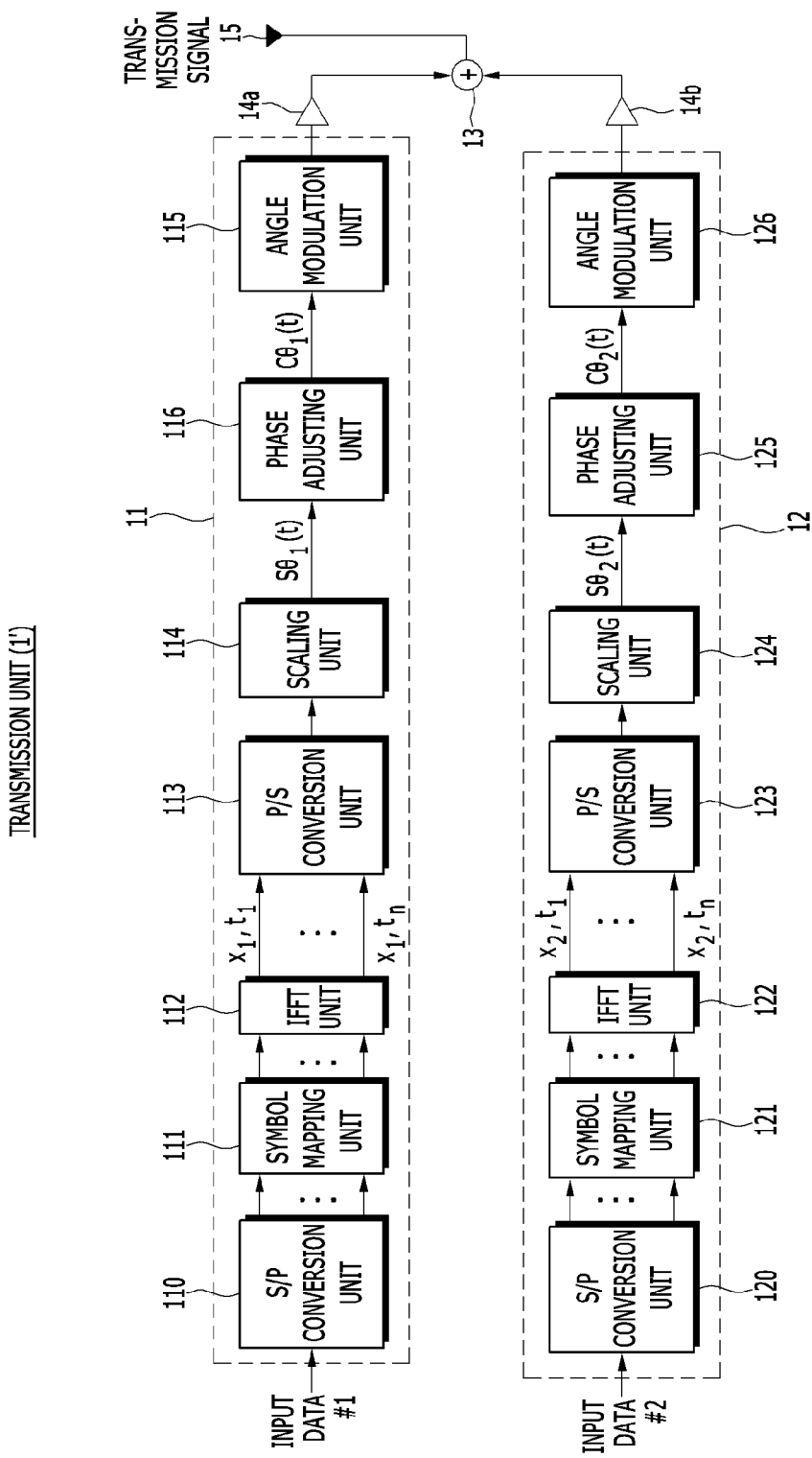
FIGS. 12 and 13 are views illustrating different structures of the transmission apparatus according to the second embodiment of the present invention.
Figure 13:
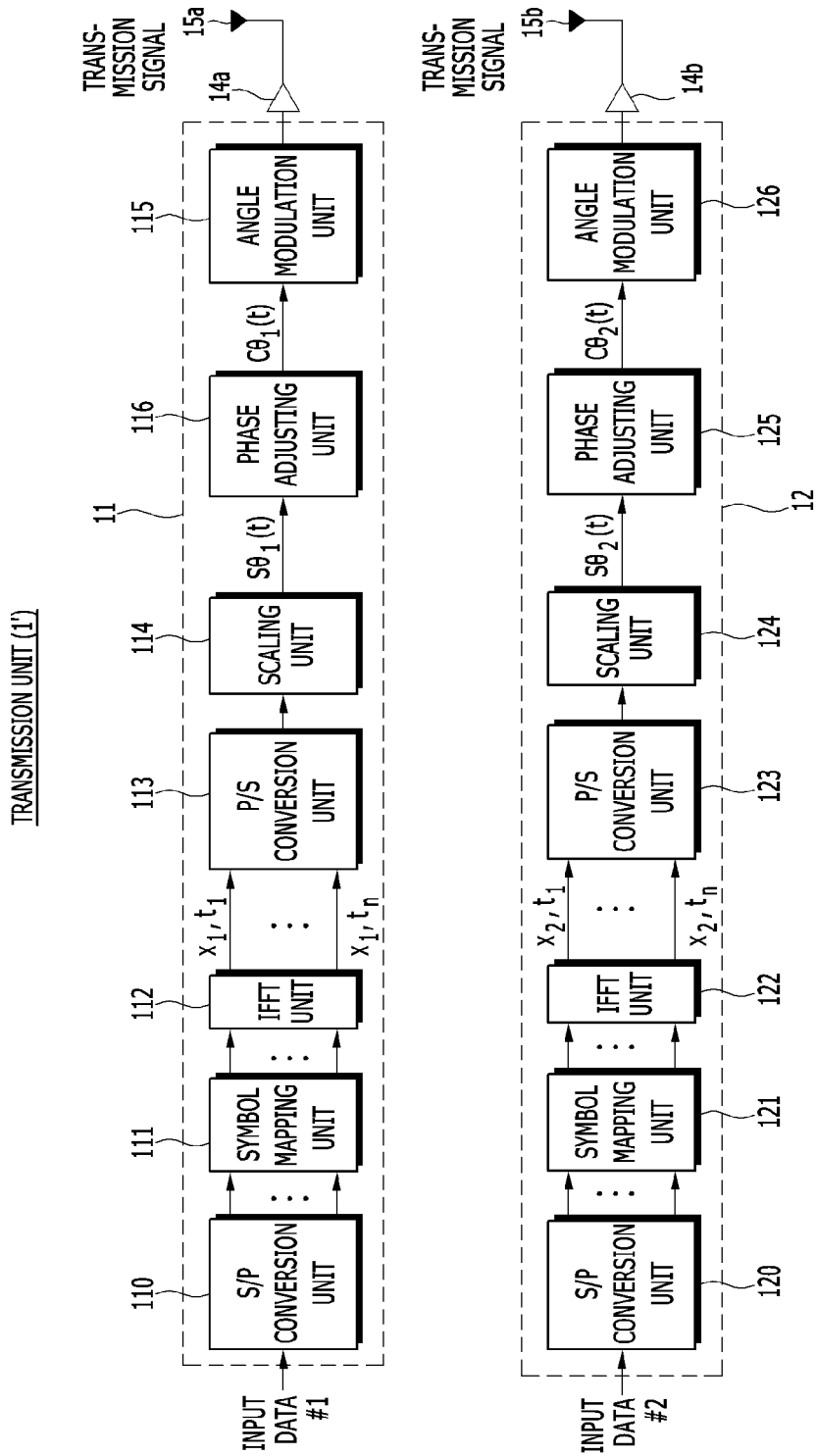

FIGS. 12 and 13 are views illustrating different structures of the transmission apparatus according to the second embodiment of the present invention.

The transmission apparatus 1' according to the second embodiment of the present invention may use two signal amplifying units. That is, as illustrated in FIG. 12, a first signal amplifying unit 14a may be connected to an output terminal of the first transmission processing unit 11, and a second signal amplifying unit 14b may be connected to the second transmission processing unit 12. The signal combining unit 13 may be connected to output terminals of the first signal amplifying unit 14a and the second signal amplifying unit 14b. In this case, the first signal amplifying unit 14a amplifies a signal processed in and output from the first transmission processing unit 11 and outputs the amplified signal, and the second signal amplifying unit 14b amplifies a signal processed in and output from the second transmission processing unit 12 and outputs the amplified signal. The signal combining unit 13 combines the signals output from the two signal amplifying units 14a and 14b and transmits the combined signal through the antenna 15.

Also, the transmission apparatus 1' according to the second embodiment of the present invention may transmit respective signals through two independent transmission antennas, without using the signal combining unit 13.

That is, as illustrated in FIG. 13, the transmission apparatus 1' may be implemented to include two transmission antennas 15a and 15b based on the structure illustrated in FIG. 12, and in this case, the signal combining unit 13 is not used. Thus, a signal output from the first signal amplifying unit 14a is transmitted through the transmission antenna 15a, and a signal output from the second signal amplifying unit 14b is transmitted through the transmission antenna 15b.

Hereinafter, a transmission method according to the second embodiment of the present invention will be described.

Figure 14:
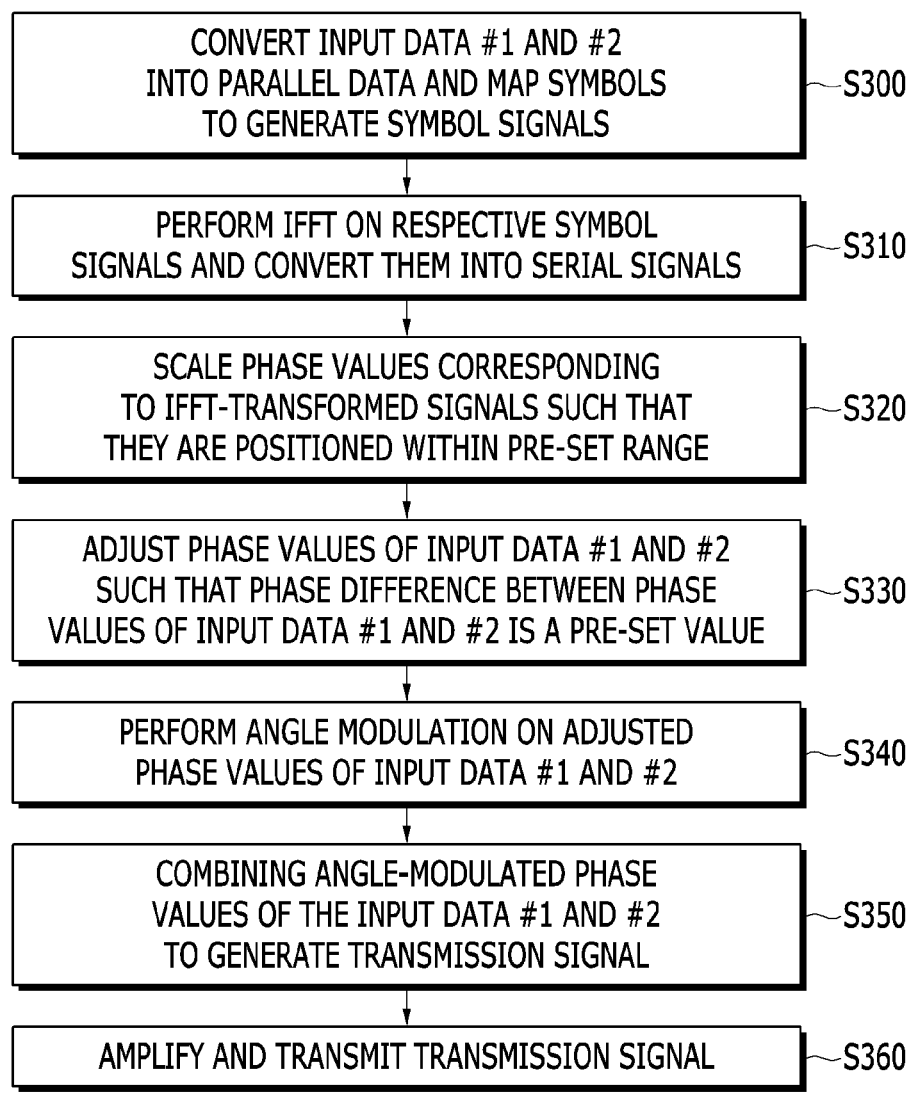
FIG. 14 is a flowchart illustrating a process of a transmission method according to the second embodiment of the present invention.

FIG. 14 is a flowchart illustrating a process of a transmission method according to the second embodiment of the present invention.

When bit-type data is input as serial data, the input data is processed by the first transmission processing unit 11 and the second transmission processing unit 12 such that it is transmittable. That is, input data #1 and input data #2 are subjected to S/P conversion, symbol mapping such as quadrature phase shift keying (QPSK), quadrature amplitude modulation, 16QAM, 64QAM, or the like, IFFT-transformed, and scaled, respectively, and phase values thereof are adjusted. Thereafter, signals corresponding to these data are angle-modulated and combined to be processed to a transmission signal. The transmission signal is amplified, multiplied by a carrier frequency, and subsequently transmitted through a single transmission antenna.

The transmission method will be described in detail. As illustrated in FIG. 14, the input data #1 is converted into parallel data through the S/P conversion unit 110, and input to the symbol mapping unit 111. Also, the input data #2 is also converted into parallel data through the S/P conversion unit 120 and input to the symbol mapping unit 121. The symbol mapping units 111 and 121 generates a symbol signal by performing modulation thereon through QPSK, 16QAM, 64QAM, or the like (S300). Here, a position of the symbol signal is as shown in FIG. 5.

Output signals from the symbol mapping units 111 and 121 have only a real number, rather than a complex signal. If a minus (−) sign is added to a conjugate signal and IFFT is performed thereon, the conjugate signal becomes a signal having only an imaginary number part.

For example, it is assumed that a size of IFFT is 128, an OFDM modulation scheme is 16QAM, and an output signal from the symbol mapping unit 111 is "1+j, 3+3×j, −1−j, . . . ,". In order to allow the symbol mapping unit 111 to have only a real number vale in an output signal, symbols may be disposed in the structure as shown in FIG. 5 and as shown in Equation 1 above.

The symbol signal disposed as shown in Equation 1 is input to the IFFT units 112 and 122, and the symbol signal is IFFT-transformed so as to be transmitted through a time axis, converted into a serial signal through the P/S conversion units 113 and 123, and subsequently input to the scaling units 114 and 124 (S310). The scaling units 114 and 124 scale the input signal such that it is positioned within a pre-set range, and output the same.

In the same manner as that of the foregoing first embodiment, it is assumed that an output signal of the IFFT unit 112 with respect to the input data #1 is $X_1, t_1, X_1, t_2, \ldots, X_1, t_n$, an output signal of the IFFT unit 122 with respect to the input data #2 is $X_2, t_1, X_2, t_2, \ldots, X_2, t_n$, and the scaling units 114 and 124 scale phase values such that individual phase values $\theta 1(t_1), \theta 1(t_2), \theta 1(t_3), \theta 1(t_4), \ldots, \theta 1(t_n)$ constituting the IFFT output signal of the input data #1 and individual phase values $\theta 2(t_1), \theta 2(t_2), \theta 2(t_3), \theta 2(t_4), \ldots, \theta 2(t_n)$ constituting the IFFT output signal of the input data #2 are within a pre-set range (S320).

That is, the scaling units 114 and 124 perform scaling such that the phase values $\theta 1(t_1), \theta 1(t_2), \theta 1(t_3), \theta 1(t_4), \ldots, \theta 1(t_n)$ with respect to the input data #1 and the phase values $\theta 2(t_1)$, θ2(t$_2$), θ2(t$_3$), θ2(t$_4$), ..., θ2(t$_n$) with respect to the input data #2 are positioned within the first pre-set range, i.e., a range from −π/4 to π/4.

In an embodiment of the present invention, a vector value with respect to the scaled phase values Sθ1(t$_1$), Sθ1(t$_2$), Sθ1 (t$_3$), Sθ1(t$_4$), ..., Sθ1(t$_n$) with respect to the input data #1 is expressed as SΘ1(T), and a vector value with respect to the scaled phase values Sθ2(t$_1$), Sθ2(t$_2$), Sθ2(t$_3$), Sθ2(t$_4$), ..., Sθ2(t$_n$) with respect to the input data #2 is expressed as SΘ2(T). Here, the scaled values are called angle modulation indices (m).

Meanwhile, the scaled phase values with respect to the input data #1 and the scaled phase values with respect to the input data #2 output from the scaling units 114 and 124 are input to the phase adjusting units 116 and 125.

Phase adjustment is performed to allow a reception apparatus to separate the input data #1 and the input data #2. In detail, the phase adjusting units 116 and 125 perform phase adjustment such that a phase difference between the scaled phase values with respect to the input data #1 and the scaled phase values with respect to the input data #2 is the pre-set value, i.e., π/2 (S330).

In the second embodiment of the present invention, for description purposes, the scaled phase values with respect to the input data #1 input to the phase adjusting unit 116 will be referred to as an input phase signal #1, and scaled phase values with respect to the input data #2 will be referred to as an input phase signal #2.

Figure 15:
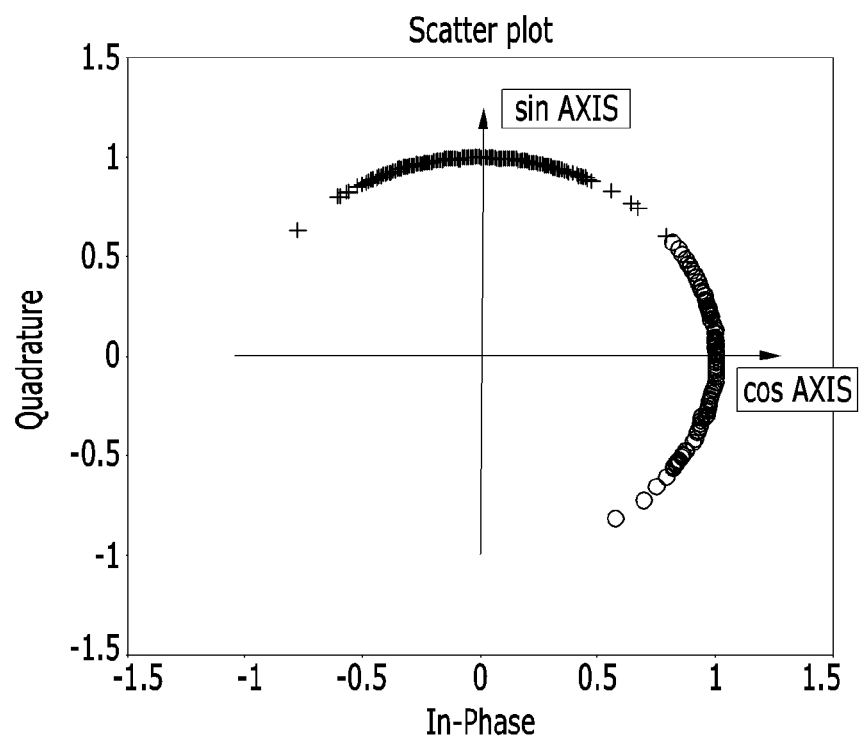
FIG. 15 and FIG. 16 are graphs showing phase-adjusted signals according to the second embodiment of the present invention.
Figure 16:
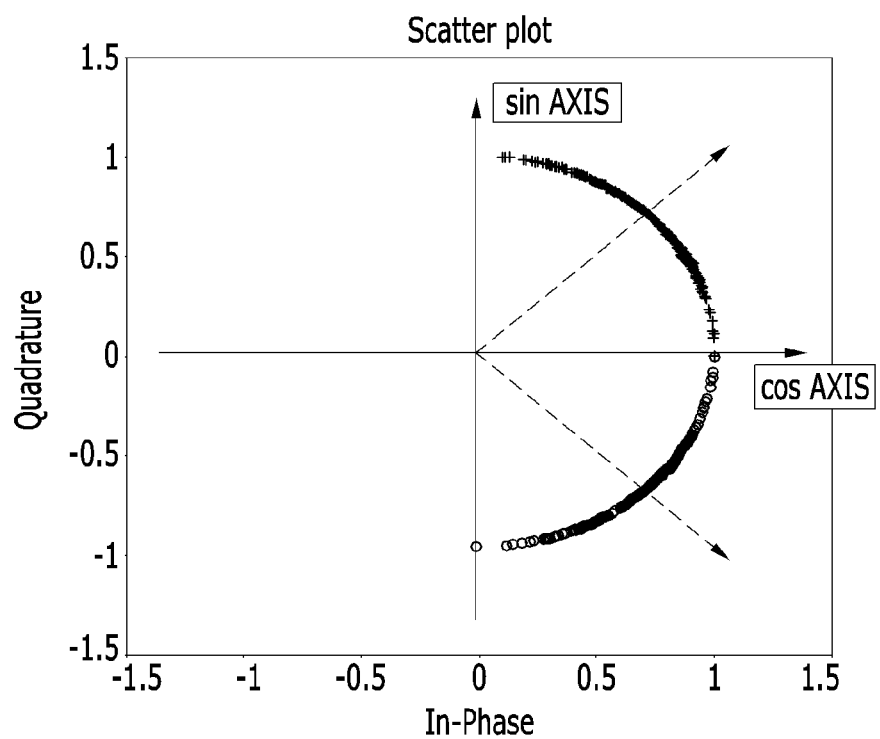

The phase vector value of the input phase signal #1 after being phase-adjusted is indicated as CΘ1(T), and the phase vector value of the input phase signal #2 after being phase-adjusted is indicated as CΘ2(T). FIG. 15 and FIG. 16 are graphs showing phase-adjusted signals.

Here, when CΘ1(T)=SΘ1(T)+phase adjusted value 1 and CΘ2(T)=SΘ2(T)+phase-adjusted value 2, the phase adjusted value 1 and the phase adjusted value 2 are set such that $$\text{phase adjusted value 1} - \text{phase adjusted value 2} \pm \frac{\pi}{2}.$$

For example, when it is assumed that the phase vector value after the input phase signal #1 is phase-adjusted is $$C\Theta 1(T) = S\Theta 1(T) + \frac{\pi}{2},$$

the phase vector value CΘ2(T) after the input phase signal #2 is phase-adjusted is CΘ2(T)=SΘ2(T)+0 as shown in FIG. 15. Or, when $$C\Theta 1(T) = S\Theta 1(T) + \frac{\pi}{4}, C\Theta 2(T) = S\Theta 2(T) - \frac{\pi}{4}$$

as shown in FIG. 16. Or, when $$C\Theta 1(T) = S\Theta 1(T) - \frac{\pi}{2} + \frac{\pi}{3}, C\Theta 2(T) = S\Theta 2(T) - \pi + \frac{\pi}{3}.$$

As described above, in the second embodiment of the present invention, the input phase signal #1 and the input phase signal #2 are phase-adjusted, respectively, such that a phase difference between the input phase signal #1 corresponding to the input data #1 and the input phase signal #2 corresponding to the input data #2 is the pre-set value π/2.

Thereafter, the angle modulation units 115 and 126 perform angle modulation on the phase-adjusted input phase signal #1 and the phase-adjusted input phase signal #2 (S340). The angle modulation may be performed in the same manner as that of the first embodiment, so a detailed description thereof will be omitted.

A signal output from the angle modulation unit 115 may be expressed as cos(CΘ1(T))+j×sin(CΘ1(T)), and a signal output from the angle modulation unit 126 may be expressed as cos(CΘ2(T))+j×sin(CΘ2(T)).

Thereafter, the signal combining unit 13 combines the signal output from the angle modulation unit 115 and the signal output from the angle modulation unit 116, and outputs a transmission signal (S350). The transmission signal is amplified by the signal amplifying unit 14 and subsequently transmitted through the antenna 15 (S360).

Here, when the transmission apparatus 1' includes two signal amplifying units as shown in FIG. 12, the signal output from the angle modulation unit 115 and the signal output from the angle modulation unit 126 may be amplified, respectively, combined, and subsequently transmitted through the transmission antenna 15. Also, when the transmission apparatus 1' includes two transmission antennas as shown in FIG. 13, the signal output from the angle modulation unit 115 and the signal output from the angle modulation unit 126 may be amplified, respectively, and subsequently transmitted through the respective transmission antennas 15.

Hereinafter, a reception method according to the second embodiment of the present invention will be described.

A reception apparatus 2 according to the second embodiment of the present invention has the same structure as that of the foregoing first embodiment. That is, the reception apparatus 2 includes the reception antenna 21, the angle demodulation unit 22, the first reception processing unit 23, and the second reception processing unit 24, and a detailed description thereof will be omitted.

Figure 17:
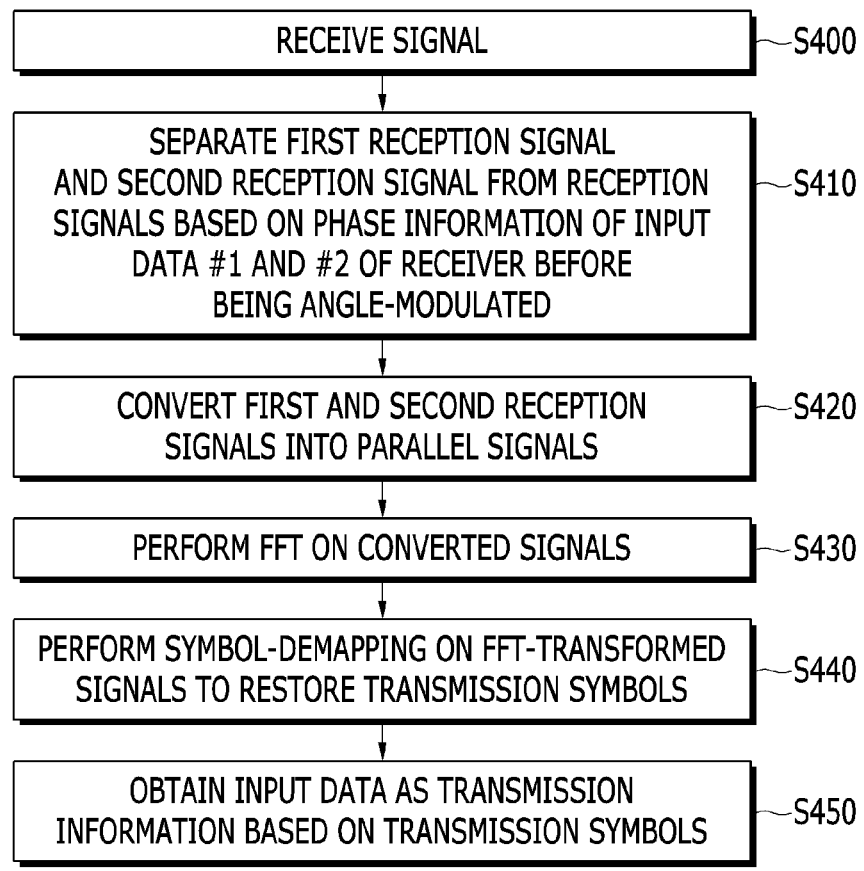
FIG. 17 is a flowchart illustrating a process of a reception method according to the second embodiment of the present invention.

FIG. 17 is a flowchart illustrating a process of a reception method according to the second embodiment of the present invention.

The reception apparatus 2 receives signals transmitted from the transmission apparatus 1 and, in this case, the reception signals are signals to which signals obtained by angle-modulating the input data #1 and the input data #2 have been added (S400). The reception apparatus 2 separates a first reception signal corresponding to the input data #1 and a second reception signal corresponding to the input data #2 (S410).

When a signal of the input data #1 after being angle-modulated is P and a signal of the input data #2 after being angle-modulated is M in the transmission apparatus 1, P may be expressed as cos(CΘ1(T))+j×sin(CΘ1(T)) and M may be expressed as cos(CΘ2(T))+j×sin(CΘ2(T)). Thus, the received signals are P+M, and these signals may be expressed as signals having a magnitude and a phase.

$$|P + M| = \text{abs}(P + M) \quad \text{(Equation 19)}$$

$$\angle(P + M) = \angle \frac{\text{Im}\{P + M\}}{\text{Re}\{P + m\}} \quad \text{(Equation 20)}$$

Equation 19 expresses the reception signals P+M by magnitude, and Equation 20 expresses the reception signals P+M by phase.

Meanwhile, the P–M signal may be obtained as follows. An absolute value of P–M may be expressed as follows.

$$|P-M| = \sqrt{4 - |P+M|^2} \quad \text{(Equation 21)}$$

Phase values of the two signals may be obtained as follows.

$$\angle(P-M) = \angle(P+M) + \frac{\pi}{2} \quad \text{(Equation 22)}$$

By using the values of P+M and P–M, the phase information ($S\theta1(t_1)$, $S\theta1(t_2)$, $S\theta1(t_3)$, $S\theta1(t_4)$, ..., $S\theta1(t_n)$) as phase values of the input data #1 before being angle-modulated in the transmission apparatus may be obtained by adding the values P+M and P–M to obtain an addition value, and subtracting a value adjusted to make a phase difference $\pi/2$ in a phase $\hat{P}$ obtained by dividing the addition value by 2, from the phase $\hat{P}$. That is, the phase information may be obtained as follows.

$$\angle \frac{\text{Im}[\hat{P}]}{\text{Re}[\hat{P}]} - \text{Phase adjusted value}_1 \quad \text{(Equation 23)}$$

For example, when a signal after being phase-adjusted in the transmission apparatus 1' is $$C\Theta1(T) = S\Theta1(T) + \frac{\pi}{4},$$

the phase of the signal before being angle-modulated is $$\angle \frac{\text{Im}[\hat{P}]}{\text{Im}[\hat{P}]} - \frac{\pi}{4}.$$

Also, the phase information ($S\theta2(t_1)$, $S\theta2(t_2)$, $S\theta2(t_3)$, $S\theta2(t_4)$, ..., $S\theta2(t_n)$) of the input data #2 before being angle-modulated in the transmission apparatus may be obtained by subtracting a value adjusted to make a phase difference $\pi/2$ from a value $\hat{M}$ obtained by subtracting P–M from P+M, from the phase of That is, the phase information may be obtained as follows.

$$\angle \frac{\text{Im}[\hat{M}]}{\text{Re}[\hat{M}]} - \text{Phase adjusted value}_2 \quad \text{(Equation 24)}$$

For example, in the case that a signal after phase-adjusted in the transmission apparatus 1' is $$C\Theta2(T) = S\Theta2(T) - \frac{\pi}{4},$$

a phase of the signal before being angle-modulated is $$\angle \frac{\text{Im}[\hat{M}]}{\text{Re}[\hat{M}]} + \frac{\pi}{4}.$$

As described above, by using the phase information of the reception signals before being angle-modulated in the transmission apparatus, the first reception signal corresponding to the input data #1 and the second reception signal corresponding to the input data #2 may be separated from the reception signals.

The angle demodulation unit 22 separates the first reception signal and the second reception signal from the reception signals and outputs them, and in this case, the first reception signal is input to the first reception processing unit 23 and the second reception signal is input to the second reception processing unit 24.

The first reception signal and the second reception signal input to the respective reception processing units 23 and 24 are first phase-adjusted by the scaling units 231 and 241. In detail, the scaling units 231 and 241 apply a modulation index (m), which was applied in the transmission apparatus 1, to the input signals, respectively. That is, the scaling units 231 and 241 divide the first reception signal as a phase estimation value corresponding to the input data #1 calculated in the angle demodulation unit 21 by the modulation index (m), and divide the second reception signal as a phase estimation value corresponding to the input data #2 calculated in the angle demodulation unit 21 by the modulation index (m).

Thereafter, the first and second reception signals input to the respective reception processing units 23 and 24 are converted into parallel signals by the S/P conversion units 232 and 242 for FFT transformation (S420), and the FFT units 232 and 242 perform FFT on the converted parallel signals to convert them into signals of a frequency domain (S430).

Thereafter, the signal demapping units 233 and 234 perform demapping on the FFT-transformed signals of the frequency domain to restore transmission symbols (S440). The P/S conversion units 234 and 244 convert the restored transmission symbols into serial form to obtain the input data #1 and the input data #2 as the original information (S450).

The embodiments of the present invention may not necessarily be implemented only through the foregoing devices and/or methods, but may also be implemented through a program for realizing functions corresponding to the configurations of the embodiments of the present invention, a recording medium including the program, or the like, and such an implementation may be easily made by a skilled person in the art to which the present invention pertains from the foregoing description of the embodiments.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A transmission method comprising:
   performing modulation by a modulator on a first input signal and a second input signal to be transmitted based on symbol mapping;
   adjusting a phase value of the second modulated input signal;
   performing angle modulation on the first input signal;
   performing angle modulation on the second input signal having the adjusted phase value; and
   transmitting by a transmission unit the angle-modulated first and second input signals,
   wherein in the performing of angle modulation on the first input signal and in the performing angle modulation on the second input signal, angle modulation is performed by converting phase values which are phase information of the corresponding input signals into cos(phase value)+j.times.sin(phase value), and wherein the obtaining of the phase information comprises: calculating a difference between the first input signal and the second input signal based on the phase difference value between the first input signal and the second input signal and the phase information being based on the phase difference.

2. The method of claim 1, further comprising scaling phase values of the first modulated input signal and the second modulated input signal such that they are positioned within a pre-set range, after the modulation is performed.

3. The method of claim 2, wherein in the adjusting of the phase value of the second input signal, a scaled phase value of the second input signal is adjusted, and in the performing of angle modulation on the first input signal, angle modulation is performed on the scaled first input signal.

4. The method of claim 2, wherein in the positioning, the phase values are scaled such that phase values of the first input signal and the second input signal are greater than −π/4 and smaller than π/4.

5. The method of claim 1, further comprising adjusting a phase of the modulated first input signal, and wherein, in the performing of angle modulation on the first input signal, angle modulation is performed on the first input signal having the adjusted phase value.

6. The method of claim 5, wherein in the adjusting of the phase value of the first input signal and in the adjusting of the phase value of the second input signal, the phase values of the corresponding input signals are adjusted based on phase adjustment values making the phase difference between the phase value of the first input signal and the phase value of the second input signal a pre-set value.

7. The method of claim 6, wherein when a vector value of the adjusted phase values of the first input signal is Cθ1(T) and a vector value of the adjusted phase values of the second input signal is Cθ2(T), the following conditions are satisfied:

$$C\Theta1(T) = S\Theta1(T) + \text{Phase adjusted value}_1$$

$$C\Theta2(T) = S\Theta2(T) + \text{Phase adjusted value}_2$$

$$\text{Phase adjusted } value_1 - \text{Phase adjusted } value_2 = \pm\frac{\pi}{2}.$$

8. A transmission apparatus comprising:
a first transmission processing unit configured to perform modulation on a first input signal to be transmitted based on symbol mapping, and perform angle modulation on the modulated first input signal;
a second transmission processing unit configured to perform modulation on a second input signal to be transmitted based on symbol mapping, adjust a phase of the modulated second input signal, and perform angle modulation on the phase-adjusted second input signal; and
a transmission unit configured to transmit the angle-modulated first and second input signals,
wherein the first transmission processing unit comprises:
  a signal conversion unit configured to convert the first input signal into a parallel signal;
  a symbol mapping unit configured to perform symbol mapping on the first input signal in the parallel form;
  an inverse fast Fourier transform (IFFT) unit configured to perform IFFT on the symbol-mapped first input signal;
  a scaling unit configured to perform scaling such that phase values as phase information corresponding to the IFFT-transformed first input signal are positioned within a pre-set range; and
  an angle modulation unit configured to angle-modulate the scaled first input signal,
wherein the first transmission processing unit further comprises a phase adjusting unit configured to adjust phases of the phase values corresponding to the scaled first input signal, wherein the angle modulation unit angle-modulates the phase-adjusted second input signal, and
wherein the obtaining of the phase information comprises: calculating a difference between the first input signal and the second input signal based on the phase difference value between the first input signal and the second input signal and the phase information being based on the phase difference.

9. The transmission apparatus of claim 8, wherein the second transmission processing unit comprises:
  a signal conversion unit configured to convert the second input signal into a parallel signal;
  a symbol mapping unit configured to perform symbol mapping on the second input signal in the parallel form;
  an IFFT unit configured to perform IFFT on the symbol-mapped second input signal;
  a scaling unit configured to perform scaling such that phase values corresponding to the IFFT-transformed second input signal are positioned within a pre-set range;
  a phase adjusting unit configured to adjust phases of the phase values corresponding to the scaled second input signal; and
  an angle modulation unit configured to angle-modulate the phase-adjusted second input signal.

10. The transmission apparatus of claim 8, wherein the phase adjusting unit of the first transmission processing unit and the phase adjusting unit of the second transmission processing unit adjust the phase values of the corresponding input signals based on phase adjustment values making the phase difference between the phase value of the first input signal and the phase value of the second input signal a pre-set value.

11. The transmission apparatus of claim 8, wherein the transmission unit comprises:
  a signal combining unit configured to combine the angle-modulated first input signal and the angle-modulated second input signal to generate a transmission signal;
  a signal amplifying unit configured to amplify the transmission signal; and
  a transmission antenna configured to transmit the transmission signal.

12. The transmission apparatus of claim 8, wherein the transmission unit comprises:
  a signal amplifying unit configured to amplify the angle-modulated first input signal;
  a signal amplifying unit configured to amplify the angle-modulated second input signal;
  a signal combining unit configured to combine the amplified first input signal and second input signal to generate a transmission signal; and
  a transmission antenna configured to transmit the transmission signal.

13. The transmission apparatus of claim 8, wherein the transmission unit comprises:
  a signal amplifying unit configured to amplify the angle-modulated first input signal;
  a signal amplifying unit configured to amplify the angle-modulated second input signal;

a transmission antenna configured to transmit the amplified first input signal; and a transmission antenna configured to transmit the amplified second input signal.

14. A reception method comprising:

receiving reception signals, with an angle demodulation unit, as a first angle-modulated input signal and a second angle-modulate input signal from a transmission apparatus;

obtaining phase information as phase values of the first input signal and the second input signal before being angle-modulated based on a difference between the first input signal and the second input signal;

separating the reception signals into a first reception signal corresponding to the first input signal and a second reception signal corresponding to the second input signal based on the phase information;

demodulating, with a first reception processing unit, the first reception signal to obtain data corresponding to the first input signal; and demodulating the second reception signal to obtain data corresponding to the second input signal, wherein the obtaining of the phase information comprises:

calculating the difference between the first input signal and the second input signal based on the phase difference value between the first input signal and the second input signal.

15. The method of claim 14, wherein the obtaining of the phase information in a case that the first input signal and the second input signal are phase-adjusted, angle-modulated, and subsequently transmitted, comprises:

a sum of the first input signal and the second input signal, and phase-adjusted values obtained by adjusting the first input signal and the second input signal.

16. The method of claim 14, wherein in the obtaining of the phase information, the phase information as phase values of the first input signal and the second input signal before being angle-modulated is obtained based on statistical characteristics of respective satellite values constituting the first input signal and the second input signal.

17. A reception apparatus comprising:

an angle demodulation unit configured to receive reception signals as an angle-modulated first signal and an angle-modulated second signal from a transmission apparatus, and separate the reception signals into a first reception signal corresponding to the first input signal and a second reception signal corresponding to the second input signal based on phase information as phase values of the first input signal and the second input signal before being angle-modulated;

a first reception processing unit configured to demodulate the first reception signal to obtain data corresponding to the first input signal; and a second reception processing unit configured to demodulate the second reception signal to obtain data corresponding to the second input signal, wherein the angle demodulation unit obtains the phase information of the first input signal and the second input signal before being angle-modulated based on a difference between the first input signal and the second input signal based on a phase difference value between the first input signal and the second input signal.

18. The reception apparatus of claim 17, wherein when the first input signal and the second input signal are phase-adjusted, angle-modulated, and subsequently transmitted, respectively, and the angle demodulation unit obtains the phase information as phase values of the first input signal and the second input signal before being angle-modulated, a sum of the first input signal and the second input signal, and phase-adjusted values obtained by adjusting the first input signal and the second input signal.

19. The reception apparatus of claim 17, wherein the first reception processing unit and the second reception processing unit, respectively, comprise:

a scaling unit configured to scale an input signal by using a modulation index applied from a transmitter;

a signal conversion unit configured to convert the scaled signal into a parallel signal;

an FFT unit configured to perform FFT on the signal in the parallel form; and a signal demapping unit configured to perform demapping on the FFT-transformed signal to demodulate it to obtain corresponding data.

* * * * *